United States Patent
Brouns et al.

(10) Patent No.: US 11,906,907 B2
(45) Date of Patent: Feb. 20, 2024

(54) APPARATUS AND METHOD FOR DETERMINING A CONDITION ASSOCIATED WITH A PELLICLE

(71) Applicants: ASML NETHERLANDS B.V., Veldhoven (NL); ASML HOLDING N.V., Veldhoven (NL)

(72) Inventors: Derk Servatius Gertruda Brouns, Herentals (BE); Joshua Adams, Wilton, CT (US); Aage Bendiksen, Fairfield, CT (US); Richard Jacobs, Brookfield, CT (US); Andrew Judge, Monroe, CT (US); Veera Venkata Narasimha Narendra Phani Kottapalli, Fairfield, CT (US); Joseph Harry Lyons, Wilton, CT (US); Theodorus Marinus Modderman, Nuenen (NL); Manish Ranjan, Eindhoven (NL); Marcus Adrianus Van De Kerkhof, Helmond (NL); Xugang Xiong, Westport, CT (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 16/765,339

(22) PCT Filed: Nov. 27, 2018

(86) PCT No.: PCT/EP2018/082670
§ 371 (c)(1),
(2) Date: May 19, 2020

(87) PCT Pub. No.: WO2019/115218
PCT Pub. Date: Jun. 20, 2019

(65) Prior Publication Data
US 2020/0341366 A1    Oct. 29, 2020

Related U.S. Application Data

(60) Provisional application No. 62/718,211, filed on Aug. 13, 2018, provisional application No. 62/620,426, (Continued)

(51) Int. Cl.
*G03F 7/20*        (2006.01)
*G03F 7/00*        (2006.01)
(Continued)

(52) U.S. Cl.
CPC .............. *G03F 7/7085* (2013.01); *G03F 1/62* (2013.01); *G03F 1/64* (2013.01); *G03F 7/70033* (2013.01);
(Continued)

(58) Field of Classification Search
CPC .......... G03F 1/64; G03F 1/62; G03F 7/70033; G03F 7/7085; G03F 7/709083;
(Continued)

(56) References Cited

U.S. PATENT DOCUMENTS 4,966,457 A * 10/1990 Hayano ............... G03F 1/62
                                                    356/239.8
6,091,069 A *  7/2000 Ashley ............... G01J 5/06
                                                    250/493.1
(Continued)

FOREIGN PATENT DOCUMENTS

CN    101196695    6/2003
CN    101299132   11/2008
(Continued)

OTHER PUBLICATIONS

International Search Report and Written Opinion issued in corresponding PCT Patent Application No. PCT/EP2018/082670, dated Dec. 12, 2017.
(Continued)

*Primary Examiner* — Christina A Riddle
(74) *Attorney, Agent, or Firm* — Pillsbury Winthrop Shaw Pittman, LLP

(57) ABSTRACT

An apparatus for determining a condition associated with a pellicle for use in a lithographic apparatus, the apparatus
(Continued)

including a sensor, wherein the sensor is configured to measure a property associated with the pellicle, the property being indicative of the pellicle condition.

20 Claims, 16 Drawing Sheets

Related U.S. Application Data filed on Jan. 22, 2018, provisional application No. 62/597,913, filed on Dec. 12, 2017.

(51) Int. Cl.
    *G03F 1/62*     (2012.01)
    *G03F 1/64*     (2012.01)

(52) U.S. Cl.
    CPC ...... *G03F 7/70891* (2013.01); *G03F 7/70983* (2013.01)

(58) Field of Classification Search
    CPC ..... G03F 1/68; G03F 1/82; G03F 1/84; G03F 7/70783; G03F 7/708; G03F 7/70808; G03F 7/70825; G03F 7/70841; G03F 7/70858–70891; G03F 7/70908; G03F 7/70916; G03F 7/70925; G03F 7/7095; G03F 7/70958; G03F 7/70975; G03F 7/70983; G03F 7/70991
    USPC ......... 355/30, 52–77, 133; 250/492.1, 492.2, 250/492.22, 493.1, 503.1, 504 r; 430/5, 430/22, 30
See application file for complete search history.

(56) References Cited

U.S. PATENT DOCUMENTS

| | | | |
|---|---|---|---|
| 2002/0192579 A1* | 12/2002 | Kamono | G03F 7/70866 430/31 |
| 2003/0197848 A1* | 10/2003 | Shiraishi | G03F 7/707 355/67 |
| 2004/0174509 A1* | 9/2004 | Jansen | G03F 7/70983 355/53 |
| 2004/0194556 A1* | 10/2004 | Shu | G03F 7/70591 73/862.045 |
| 2006/0033921 A1 | 2/2006 | Den Boef et al. | |
| 2006/0066855 A1 | 3/2006 | Boef et al. | |
| 2009/0263750 A1* | 10/2009 | Maeda | G01N 21/956 355/53 |
| 2010/0045955 A1 | 2/2010 | Vladimirsky et al. | |
| 2010/0201963 A1 | 8/2010 | Cramer et al. | |
| 2010/0328655 A1 | 12/2010 | Den Boef | |
| 2011/0014577 A1* | 1/2011 | Hashimoto | G03F 7/70983 430/325 |
| 2011/0027704 A1 | 2/2011 | Cramer et al. | |
| 2011/0069292 A1 | 3/2011 | Den Boef | |
| 2015/0293460 A1* | 10/2015 | Takehisa | G03F 1/84 355/67 |
| 2017/0017150 A1 | 1/2017 | Yakunin et al. | |
| 2018/0364561 A1* | 12/2018 | Vles | G03F 7/70983 |

FOREIGN PATENT DOCUMENTS

| | | |
|---|---|---|
| CN | 104483817 | 4/2015 |
| EP | 1925981 | 5/2008 |
| JP | S63153451 | 6/1988 |
| JP | H08271439 | 10/1996 |
| JP | 2002372777 | 12/2002 |
| JP | 2007256577 | 10/2007 |
| JP | 2015204339 | 11/2015 |
| TW | 200942991 | 10/2009 |
| TW | 201730692 | 9/2017 |
| WO | 2016124536 | 8/2016 |
| WO | 2017102380 | 6/2017 |

OTHER PUBLICATIONS

Research Disclosure No. 599029, dated Feb. 12, 2014.
Research Disclosure No. 618001, dated Aug. 24, 2015.
Taiwanese Office Action issued in corresponding Taiwanese Patent Application No. 107144295, dated Jul. 6, 2022.
Office Action mailed Nov. 9, 2022, issued in corresponding Japanese Patent Application No. 2020-526216, pp. 1-7.

* cited by examiner

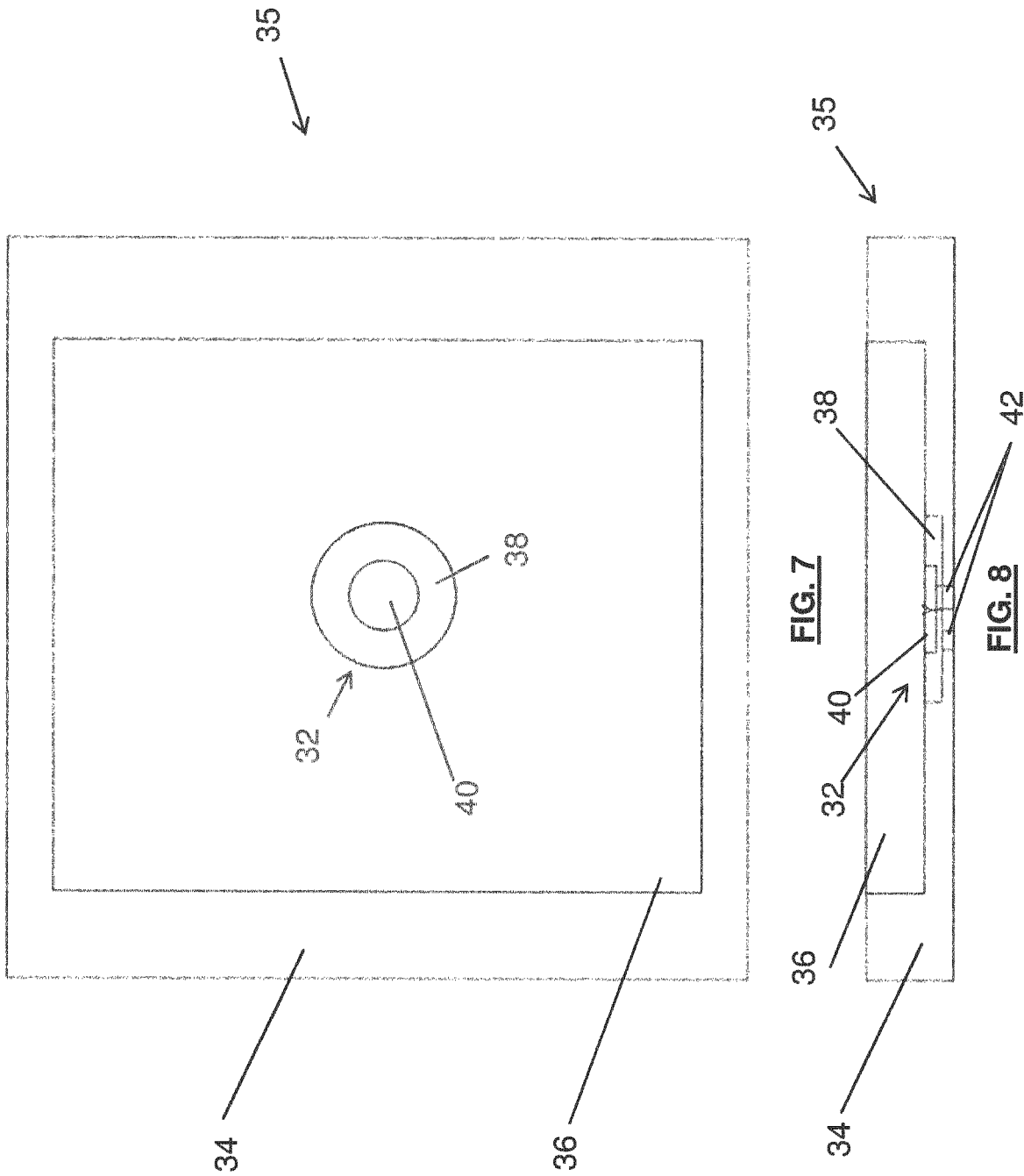

APPARATUS AND METHOD FOR DETERMINING A CONDITION ASSOCIATED WITH A PELLICLE

CROSS-REFERENCE TO RELATED APPLICATIONS

This application is the U.S. national entry of PCT patent application no. PCT/EP2018/082670, which was filed on Nov. 27, 2018, which claims the benefit of priority of U.S. patent application No. 62/597,913 which was filed on 12 Dec. 2017, U.S. patent application No. 62/620,426 which was filed on 22 Jan. 2018 and U.S. patent application No. 62/718,211 which was filed on 13 Aug. 2018 which are all incorporated herein in their entireties by reference.

FIELD

The present description relates to an apparatus and method for determining a condition associated with a pellicle. A pellicle may be suitable for use with a patterning device for a lithographic apparatus. The present description has particular, but not exclusive, pertinence to an EUV lithographic apparatus and/or an EUV tool.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

The use of pellicles in lithography is well-known and well-established. A typical pellicle in a DUV lithographic apparatus is a membrane which is located away from the patterning device and is out of the focal plane of a lithographic apparatus in use. Because the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

It may be desirable to use a pellicle in an EUV lithographic apparatus. EUV lithography differs from DUV lithography in that it is typically performed in a vacuum and the patterning device is typically reflective rather than being transmissive.

SUMMARY

It is desirable to provide an apparatus and method for determining a condition associated with a pellicle which overcomes or mitigates one or more problems associated with the art. Examples described herein may have use in an EUV lithographic apparatus. Examples described herein may also have use in a DUV lithographic apparatus and/or another form of lithographic tools. Examples described herein may also have use in other tools that use EUV or DUV and/or that are associated with a lithographic process (e.g., an inspection tool such as a patterning device inspection tool).

According to an aspect, there is provided an apparatus for determining a condition associated with a pellicle for use in a lithographic apparatus, the apparatus comprising a sensor, wherein the sensor is configured to measure a property associated with the pellicle, the property being indicative of the pellicle condition.

This may have advantages of providing pellicle failure information, increasing the throughput of substrates, and avoiding damage to substrates.

The property associated with the pellicle may be a temperature or a temperature profile of the pellicle and/or may be a temperature or a temperature profile of a particle on the pellicle.

This may have an advantage of detecting thermal hot spots (particle driven or otherwise) prior to damage being caused to the pellicle. This may have an advantage that a requirement on power/absorption related pellicle lifetime uncertainty, absolute power measurement in the lithographic apparatus and in pellicle test stands, and/or matching off-line pellicle tests to lithographic conditions can be relaxed.

The sensor may be configured to measure infrared radiation (IR) associated with the pellicle. The sensor may be configured to measure an IR emission spectrum associated with the pellicle.

The sensor may be configured to measure the intensity of the IR emission in a wavelength band of 2-8 μm. The wavelength band may be one or more selected from: 2-7 μm, 2-6 μm, 2-5 μm, 2-4 μm, 2-3 μm, 3-5 μm, 4-5 μm, 3-6 μm, 4-6 μm and/or 5-6 μm.

The sensor may be configured to measure an IR emission differential. The differential IR emission measurement may be for determining the ratio of the intensity in a 2-3 μm band to a 6-8 μm band.

The sensor may comprise a photodiode that is configured to provide a bias voltage that is scannable to establish the IR emission spectrum. The photodiode may be a biased Schottky barrier photodiode or B—SI junction detectors.

The acquisition rate of the temperature measurement may be at least 10 Hz, and may be at least 1 kHz.

The sensor may be configured to locate the particle on the pellicle by identifying a contrast between the infrared radiation being received from the particle and the pellicle.

The apparatus may be configured to actively control the power of a radiation beam to maintain the pellicle at a predetermined temperature.

This may have an advantage that the lithographic apparatus may be used at a highest safe level of throughout of substrates The apparatus may be configured to activate a split exposure scheme based on the temperature measurement.

This may have an advantage that throughout can be increased when compared to reducing the exposure radiation beam power.

The apparatus may comprise at least one transparent layer that allows IR radiation to pass.

This may have an advantage that the apparatus can be located outside of the lithographic apparatus.

The sensor may be configured to be located substantially centrally in a pupil facet module in the lithographic apparatus. The sensor may be located outside of the radiation beam path.

The sensor may be configured to be located at an angle of incidence with respect to the pellicle of at least 45°. The IR sensor 26 may be located at an angle of incidence with respect to the pellicle of at least 50°, 55°, 60°, 65°, 70°, 75°, 80°, or 85°.

This may have an advantage that emissions from the patterning device to the sensor are suppressed.

The sensor may be integrated into a pellicle carrier.

The property associated with the pellicle may be capacitance and the sensor may be a capacitance sensor.

This may have an advantage of reducing or preventing lithographic apparatus damage, reducing or preventing cross contamination to one or more other patterning devices, and/or avoiding requiring much additional hardware for the lithographic apparatus.

The apparatus may be configured such that electrical contacts of the sensor are connectable from outside the pellicle carrier while the pellicle carrier is closed.

This may have an advantage that the pellicle carrier does not need to be opened to detect the condition of the pellicle.

The apparatus may be configured such that the pellicle is illuminated with radiation over a predefined pellicle area and the sensor is configured to measure the radiation reflected from the pellicle.

This may have an advantage of reducing the risk of a patterning device pattern diffraction pattern interfering with the particle detection system.

The apparatus may be configured to successively illuminate predefined pellicle areas with radiation.

The predefined pellicle area may be an illumination line.

The illumination line may be formed from a plane of illumination intersecting with the pellicle.

The apparatus may be configured to illuminate the pellicle at an angle of incidence with respect to the pellicle of at least 45°.

This may have an advantage of reducing the risk of a patterning device diffraction creating false positives for particle detection.

The sensor may be orientated so as not to be in the path of specular reflection from the pellicle.

The sensor may be orientated perpendicularly to the illuminating plane.

The apparatus may comprise a shadowing structure comprising an aperture for shadowing at least part of a patterning device while allowing the radiation to be incident on the pellicle.

This may have an advantage that unwanted radiation can be blocked to avoid ghost patterns. This may have an advantage that the apparatus can inspect different types of surfaces and is versatile. This may be because the method does not depend on an optical property of the surface or a wavelength of the illuminating radiation.

The aperture may have a width such that the pre-defined pellicle area can be viewed by the sensor while the visibility of a patterning device pattern is substantially reduced due to shadowing effects of the shadowing structure.

The sensor may be associated with a pellicle frame of a pellicle assembly. This may have an advantage of providing immediate feedback of a pellicle rupture or impending pellicle rupture. This may have an advantage of avoiding the need for multiple detectors throughout the system monitoring the pellicle or patterning device, thus reducing costs.

The sensor may be at least partially in the pellicle frame.

The sensor may be a proximity sensor configured to measure distance to the pellicle.

The proximity sensor may be cap gauge sensor or an induction sensor.

The apparatus may be configured to wirelessly transmit data from the sensor.

The sensor may be configured to filter out signals other than signals from an inspection plane, wherein the inspection plane corresponds to the location of the pellicle. This may have an advantage that false detection of defects in the pellicle may be avoided. This may have an advantage of a more robust and reliable method of detecting defects.

The sensor may be a light field camera, wherein the light field camera is configured to only output radiation intensity information from the depth of the inspection plane. This may have an advantage that only a single object (i.e. a camera/lens) is aligned with any precision.

The light field camera may be configured to filter out radiation intensity information that spans a particular range of angles known to not correspond to the inspection plane.

The apparatus may be configured to operate a particle detection algorithm on the signals corresponding to the inspection plane.

The inspection plane may correspond to a range of maximum pellicle displacement.

The apparatus may further comprise a radiation source configured to illuminate the pellicle with radiation having a wavelength that is substantially not transmitted through the pellicle, and the sensor may be configured to measure the radiation associated with the pellicle. This may have an advantage that radiation is prevented from passing through the pellicle to reach the patterning device. This may prevent or substantially reduce ghosting when compared to using other wavelengths of radiation.

The transmittance of the radiation through the pellicle may be less than or equal to 10%, less than or equal to 1%, or less than or equal to 0.1%.

The pellicle may be a polycrystalline pellicle. The wavelength of the radiation may be in a range selected from: 180 nm-380 nm, 356 nm-365 nm, 356 nm-370 nm, 356 nm-375 nm, 361 nm-365 nm, 361 nm-370 nm, 361 nm-375 nm, or 364 nm-366 nm.

The wavelength of the radiation may be 365 nm.

The apparatus may be configured such that the radiation is collimated or divergent when incident on the pellicle.

The apparatus may be configured such that the pellicle is illuminated over part of the width, the full width or the full area of the pellicle at once.

The apparatus may comprise a plurality of radiation sources.

The pellicle may be made from silicon or MoSi.

The sensor may comprise the radiation source and/or a patterning device backside inspection tool.

The sensor may be configured to measure the property associated with the pellicle when the pellicle is in a radiation beam exposure position in the lithographic apparatus.

This may have an advantage of in situ detection of the condition of the pellicle.

The sensor may be configured to measure the property associated with the pellicle when the exposure radiation beam is incident on the pellicle in the radiation beam exposure position.

This may have an advantage of real time detection of the condition of the pellicle.

The apparatus may comprise a filter for filtering out radiation from the exposure radiation beam.

The apparatus may be configured to stop a radiation beam and/or prevent further pulses of the radiation beam based on the condition associated with the pellicle.

This may have an advantage of preventing damage to the patterning device.

The condition associated with the pellicle may be one or more selected from: lifetime of the pellicle, integrity of the pellicle, a defect in the pellicle, a local transmission change of the pellicle, a particle located on the pellicle, a stain on the pellicle, a deformation of the pellicle, an impending rupture of the pellicle, a rupture of the pellicle, and/or the presence of the pellicle.

The sensor may be not in direct line of sight of the pellicle.

According to an aspect, there is provided an assembly comprising an apparatus for determining a condition associated with a pellicle as described herein and a lithographic apparatus, the lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, and a projection system configured to project the patterned radiation beam onto the substrate.

According to an aspect, there is provided a method of determining a condition associated with a pellicle for use in a lithographic apparatus, the method comprising measuring a property associated with the pellicle using a sensor, the property being indicative of the pellicle condition.

The property associated with the pellicle may be a temperature profile of the pellicle and/or may be a temperature profile of a particle on the pellicle.

The method may further comprise measuring infrared radiation (IR) associated with the pellicle using the sensor.

The method may further comprise identifying a particle on the pellicle by identifying a contrast between the infrared radiation being received from the particle and the pellicle.

The method may further comprise determining a maximum allowed power for a pellicle and/or a pellicle and patterning device pair.

The method may further comprise measuring the property associated with the pellicle when the sensor is integrated into a pellicle carrier.

The method may further comprise measuring a capacitance of the pellicle using a capacitance sensor.

The method may further comprise illuminating the pellicle with radiation over a predefined pellicle area and measuring the radiation reflected from the pellicle with the sensor.

The method may further comprise successively illuminating predefined pellicle areas with the radiation.

The method may further comprise illuminating the predefined pellicle area using a plane of illumination that forms an illumination line when it intersects with the pellicle.

The method may further comprise illuminating the pellicle at an angle of incidence with respect to the pellicle of at least 45°.

The method may further comprise orientating the sensor so as to be perpendicular to the illuminating plane.

The method may further comprise illuminating the pellicle and viewing a pre-defined pellicle area with the sensor while substantially reducing the visibility of a patterning device pattern from a patterning device due to shadowing effects of a shadowing structure comprising an aperture.

The sensor may be associated with a pellicle frame of a pellicle assembly.

The method may further comprise measuring the distance to the pellicle using a proximity sensor.

The method may further comprise wirelessly transmitting data from the sensor.

The method may further comprise filtering out signals other than signals from an inspection plane, wherein the inspection plane corresponds to the location of the pellicle.

The sensor may be a light field camera and the method further comprises only outputting radiation intensity information from the depth of the inspection plane.

The method may further comprise operating a particle detection algorithm on the signals corresponding to the inspection plane.

The method may further comprise illuminating the pellicle with radiation having a wavelength that is substantially not transmitted through the pellicle and measuring the radiation associated with the pellicle using the sensor.

The transmittance of the radiation through the pellicle may be less than or equal to 10%, less than or equal to 1%, or less than or equal to 0.1%.

The pellicle may be a polycrystalline pellicle.

The wavelength of the radiation may be in a range selected from: 180 nm-380 nm, 356 nm-365 nm, 356 nm-370 nm, 356 nm-375 nm, 361 nm-365 nm, 361 nm-370 nm, or 361 nm-375 nm.

The wavelength of the radiation may be 365 nm.

The method may further comprise illuminating the pellicle with radiation that is collimated or divergent when incident on the pellicle.

The method may further comprise illuminating the pellicle over part of the width, the full width or the full area of the pellicle at once.

The method may further comprise illuminating the pellicle from a plurality of radiation sources.

The pellicle may be made from silicon or MoSi.

The method may further comprise using the sensor to illuminate the pellicle with the radiation having the wavelength that is substantially not transmitted through the pellicle.

The method may further comprise measuring the property associated with the pellicle when the pellicle is in a radiation beam exposure position in the lithographic apparatus.

The method may further comprise measuring the property associated with the pellicle when the exposure radiation beam is incident on the pellicle in the radiation beam exposure position.

The method may further comprise stopping a radiation beam and/or preventing further pulses of the radiation beam based on the condition associated with the pellicle.

The condition associated with the pellicle may be one or more selected from: lifetime of the pellicle, integrity of the pellicle, a defect in the pellicle, a transmission change of the pellicle, a particle located on the pellicle, a stain on the pellicle, a deformation of the pellicle, an impending rupture of the pellicle, a rupture of the pellicle, and/or the presence of the pellicle.

According to an aspect, there is provided a computer program comprising computer readable instructions configured to cause a computer to carry out a method as described herein.

According to an aspect, there is provided a computer readable medium carrying a computer program as described herein.

According to an aspect, there is provided a computer apparatus for determining a condition associated with a pellicle comprising a memory storing processor readable instructions; and a processor arranged to read and execute instructions stored in the memory, wherein the processor readable instructions comprise instructions arranged to control the computer to carry out a method as described herein.

BRIEF DESCRIPTION OF THE DRAWINGS

Embodiments of the invention will now be described, by way of example only, with reference to the accompanying schematic drawings, in which:

FIG. 7 schematically depicts a top view of a capacitance sensor integrated into a base plate of a pellicle carrier;

FIG. 8 schematically depicts a side view of the capacitance sensor integrated into the base plate of the pellicle carrier;

DETAILED DESCRIPTION

Figure 1:
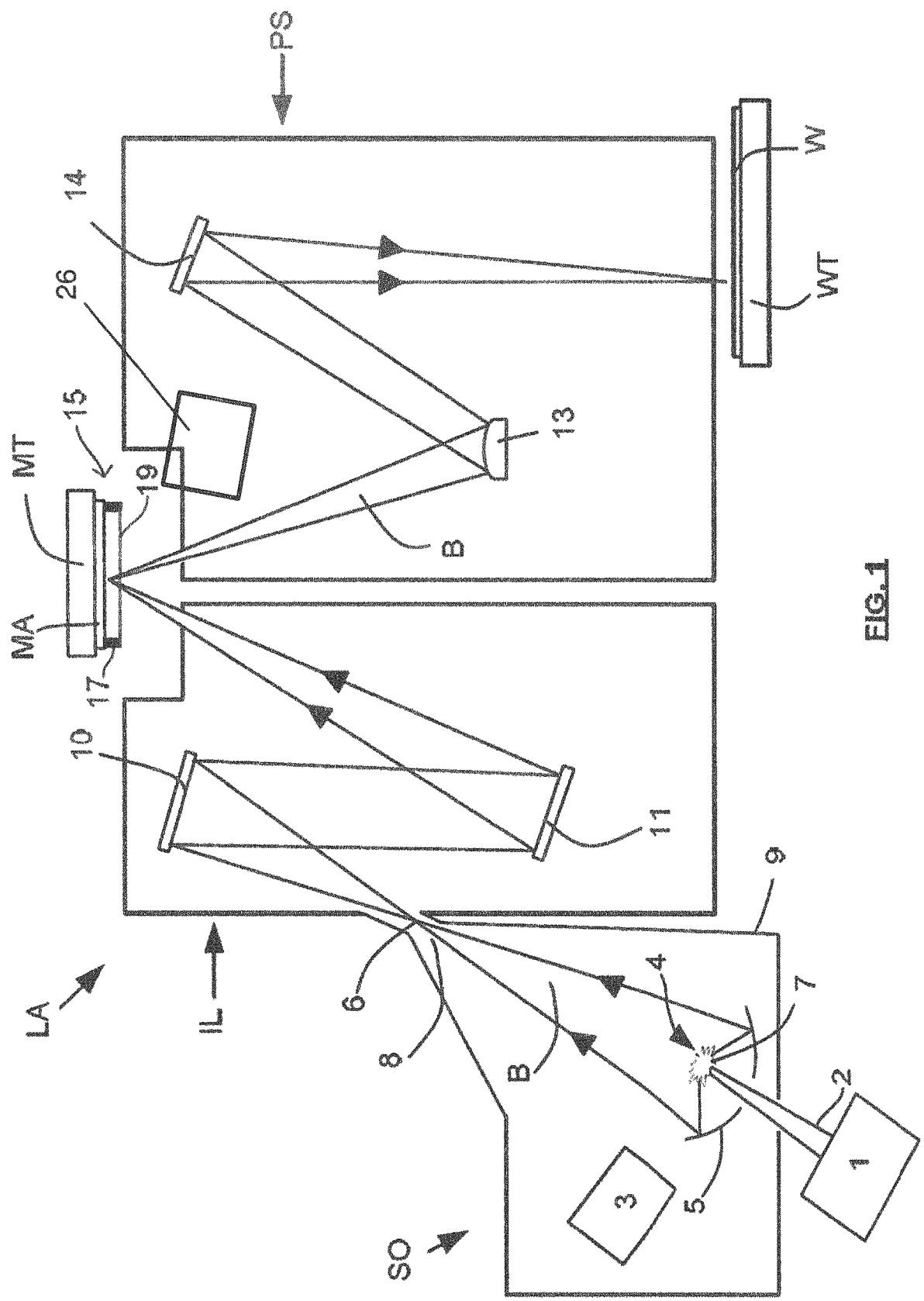
FIG. 1 schematically depicts a lithographic system comprising a lithographic apparatus including an example pellicle assembly.

FIG. 1 shows a lithographic system including a sensor 26 according to an embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus LA aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source. A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g. EUV radiation having a desired wavelength such as about 13.5 nm). The collector 5 may have an ellipsoidal configuration, having two ellipse focal points. A first focal point may be at the plasma formation region 4, and a second focal point may be at an intermediate focus 6, as discussed below.

The laser 1 may be remote from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular intensity distribution. The radiation beam B passes from the illumination system IL and is incident upon the patterning device MA held by the support structure MT. The patterning device MA is protected by a pellicle 19, which is held in place by a pellicle frame 17. The pellicle 19 and the pellicle frame 17 together form a pellicle assembly 15. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

As was described briefly above, the pellicle assembly 15 includes the pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. This position of the pellicle 19 in the lithographic apparatus LA is an EUV radiation exposure position. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, at least 80% of the EUV radiation or at least 90% of the EUV radiation. The pellicle 19 acts to protect the patterning device MA from particle contamination. The pellicle 19 may be herein referred to as an EUV transparent pellicle. The pellicle 19 may be made from any material which is sufficiently transparent for EUV radiation, such as molybdenum silicide (MoSi). MoSi is stronger than silicon at high temperatures because it cools more quickly than silicon. In other examples, the pellicle may be made from other materials, such as silicon, silicon nitride, graphene or graphene derivatives, carbon nanotube, or multi-layer membranes formed by alternating EUV transparent materials.

While efforts may be made to maintain a clean environment inside the lithographic apparatus LA, particles may still be present inside the lithographic apparatus LA. In the absence of the pellicle 19, particles may be deposited onto the patterning device MA. Particles on the patterning device MA may disadvantageously affect the pattern that is imparted to the radiation beam B and therefore the pattern that is transferred to the substrate W. The pellicle 19 provides a barrier between the patterning device MA and the environment in the lithographic apparatus LA in order to prevent particles from being deposited on the patterning device MA.

In use, the pellicle 19 is positioned at a distance from the patterning device MA that is sufficient such that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some examples, the separation between the pellicle 19 and the patterning device MA may, for example, be between 2 mm and 3 mm (e.g. around 2.5 mm). In some examples, a separation between the pellicle 19 and the patterning device may be adjustable.

Figure 2:
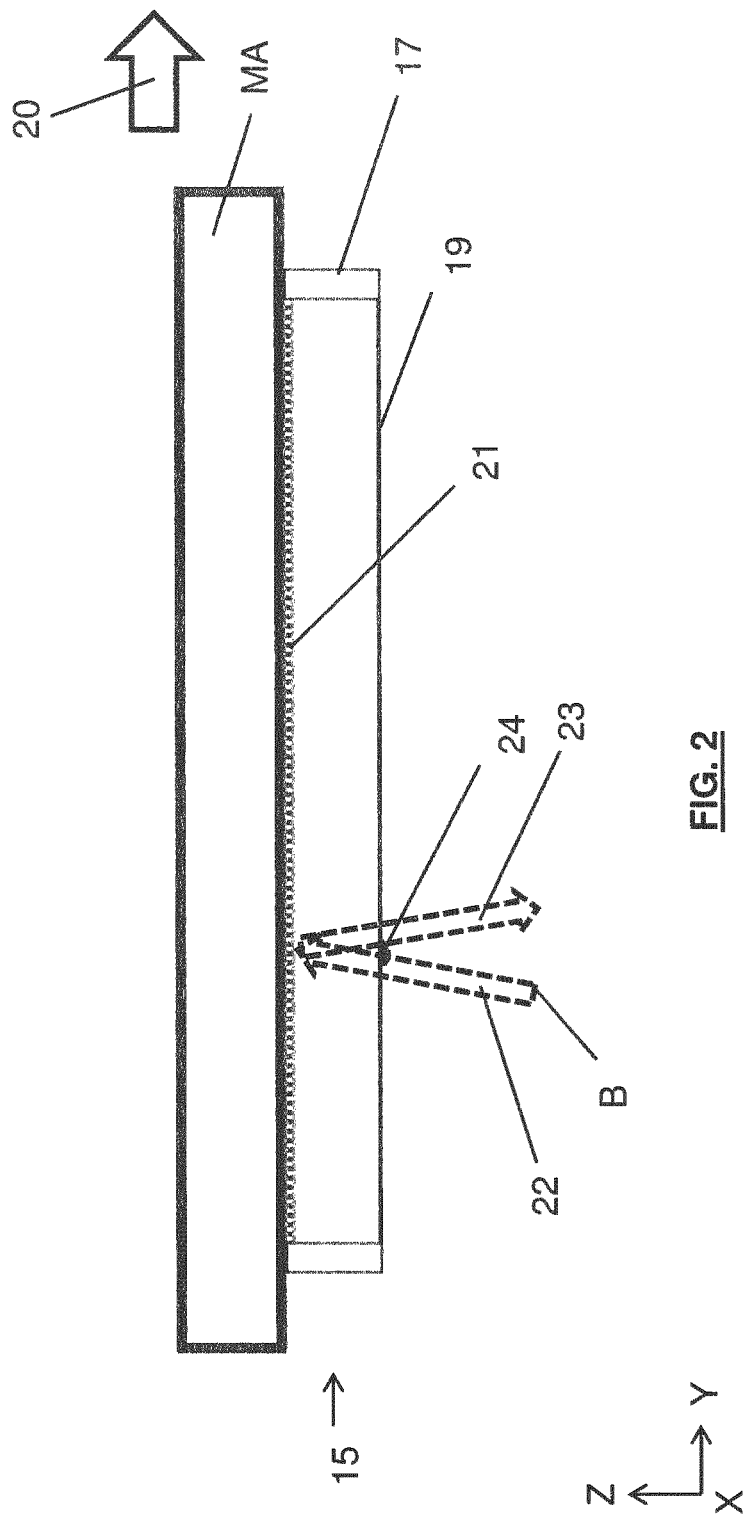
FIG. 2 schematically depicts a side view of a pellicle assembly and a patterning device.

FIG. 2 shows a schematic side view of an example pellicle assembly 15 and patterning device MA. The pellicle assembly 15 and the patterning device MA may first move in the direction left to right as depicted by arrow 20 (the y direction), i.e. the patterning device MA is scanned in this direction. The scanning may then occur in the opposite direction as generally, in a scanning lithographic apparatus, a patterning device MA is scanned in one direction and then in the opposite direction. The patterning device MA has a pattern 21 (e.g., a device or circuit pattern) that provides the pattern that is imparted to the radiation beam B after reflection from the patterning device MA. The pellicle 19 is in the radiation beam exposure position in the lithographic apparatus LA, i.e. the pellicle 19 is in-situ.

The radiation beam B (i.e. actinic energy), depicted by arrow 22, coming from the actinic energy source (not shown) towards the patterning device MA, and the radiation beam B, depicted by arrow 23, being reflected from the patterning device MA to the substrate W (see FIG. 1), delivers a relatively large amount of energy to the pellicle 19. The pellicle 19 is relatively thin (e.g. less than 100 nm) and is therefore limited in the amount of heat that can be conducted away. Due to inherent EUV absorption, of the order of 10-20%, and in the absence of an effective cooling mechanism, the pellicle 19 will heat up to several hundred degrees (before radiative cooling balances the EUV absorption load). This is schematically illustrated as a hot spot 24 on the pellicle 19 in FIG. 2.

Figure 3:
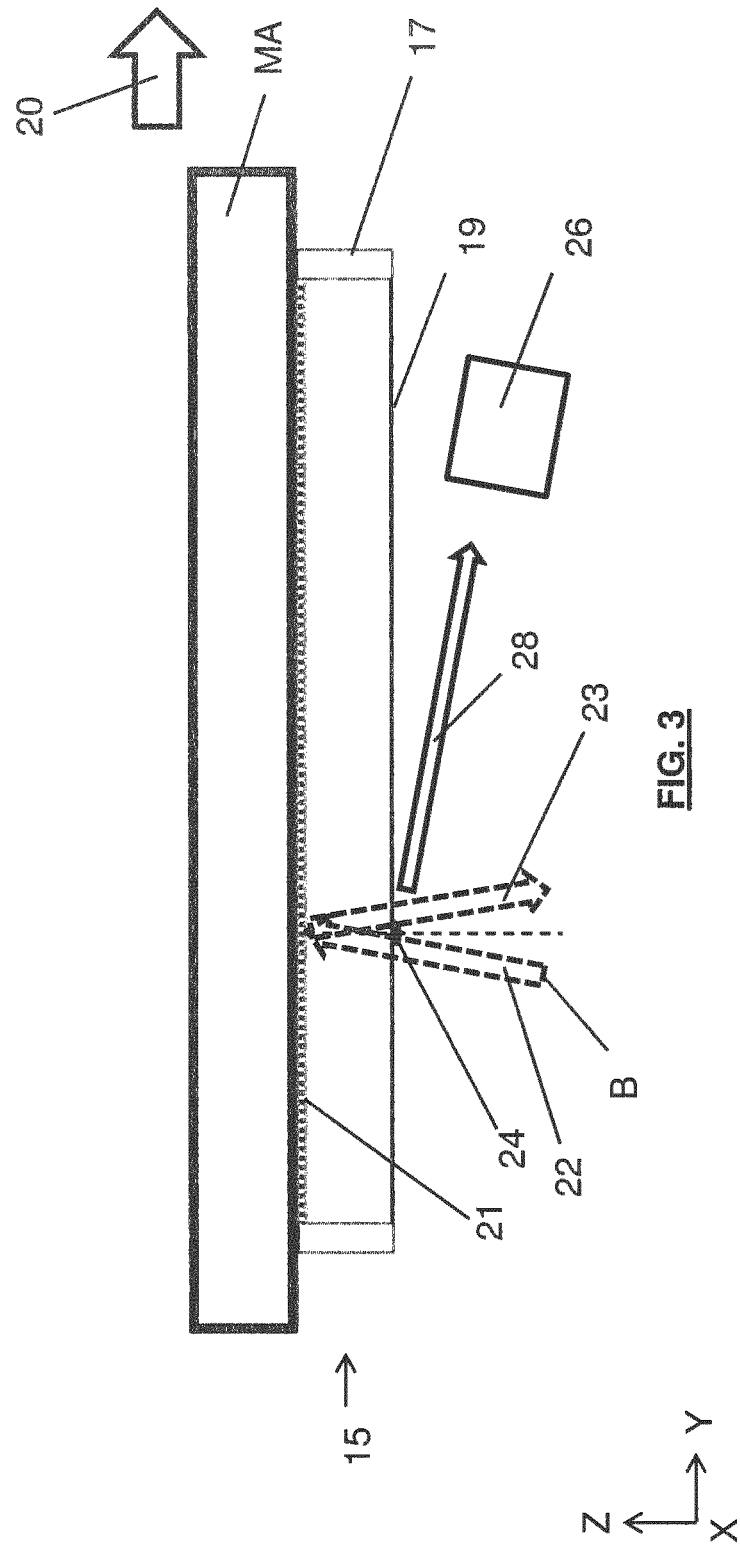
FIG. 3 schematically depicts a side view of a pellicle assembly, a patterning device and an IR sensor.

FIG. 3 shows the same pellicle assembly 15 and patterning device MA of FIG. 2 but there is also shown a sensor 26 positioned to have a view of the pellicle 19. In this example, the sensor 26 is an infrared sensor 26, e.g. an IR camera, positioned to have a view of the pellicle 19. As the pellicle 19 heats up due to the radiation beam B being incident on it, the pellicle 19 emits IR radiation in an IR emission spectrum which may be detected by the IR sensor 26. The IR radiation is depicted by arrow 28. The IR sensor 26 may measure IR radiation associated with the pellicle 19. The IR sensor 26 may measure an IR emission spectrum associated with the pellicle 19.

A temperature of the pellicle 19 may be considered to be a property associated with the pellicle 19. A temperature profile of the pellicle 19, i.e. its temperature over a predefined time, may be considered to be a property associated with the pellicle 19. The temperature and/or temperature profile of the pellicle 19 can be derived from the IR emission spectrum. This requires the emissivity of the pellicle 19 to be known (e.g. theoretically from its constituent materials, or experimentally from off-line thermal qualification).

Figure 4:
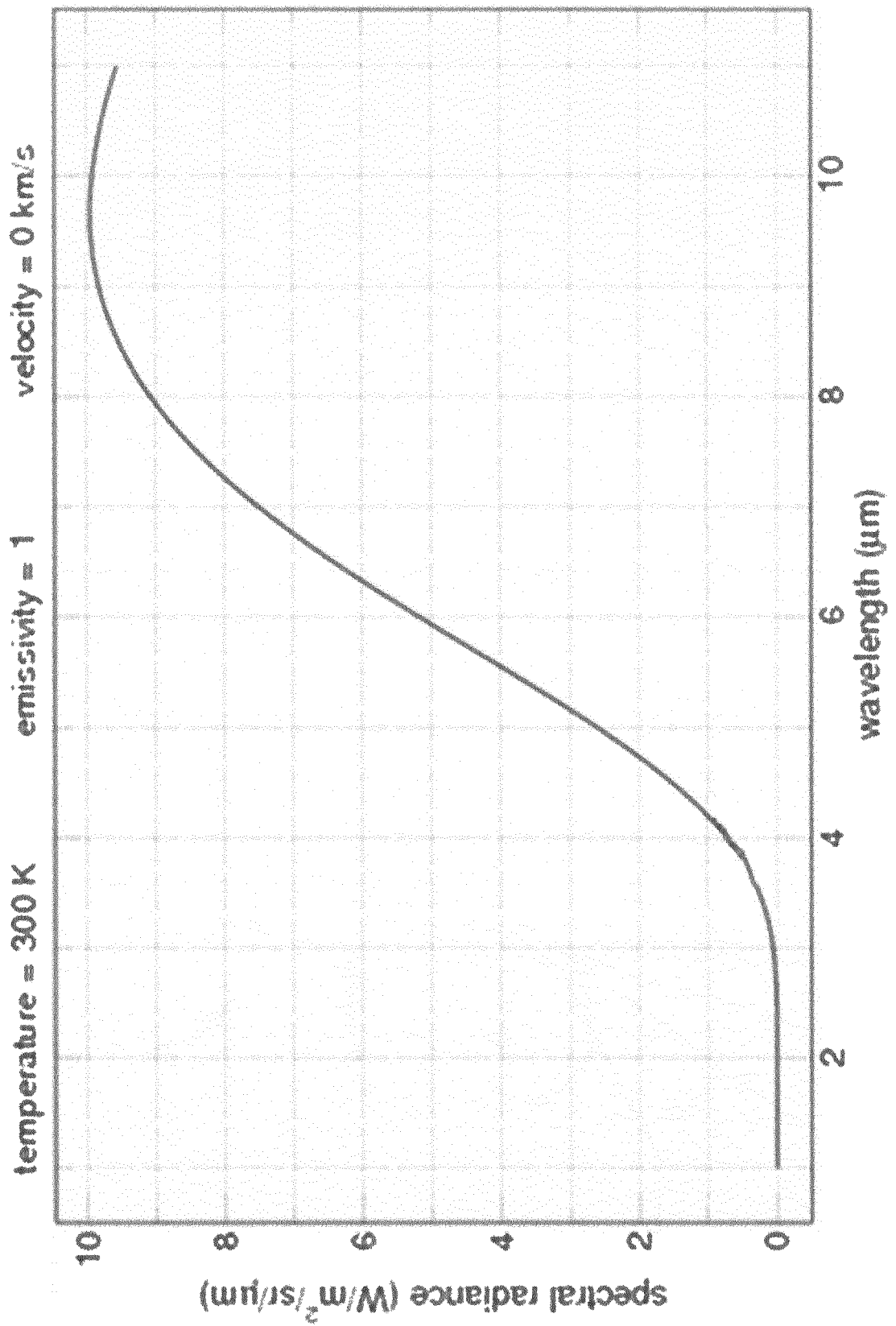
FIG. 4 depicts a graph of a blackbody spectrum at room temperature.
Figure 5:
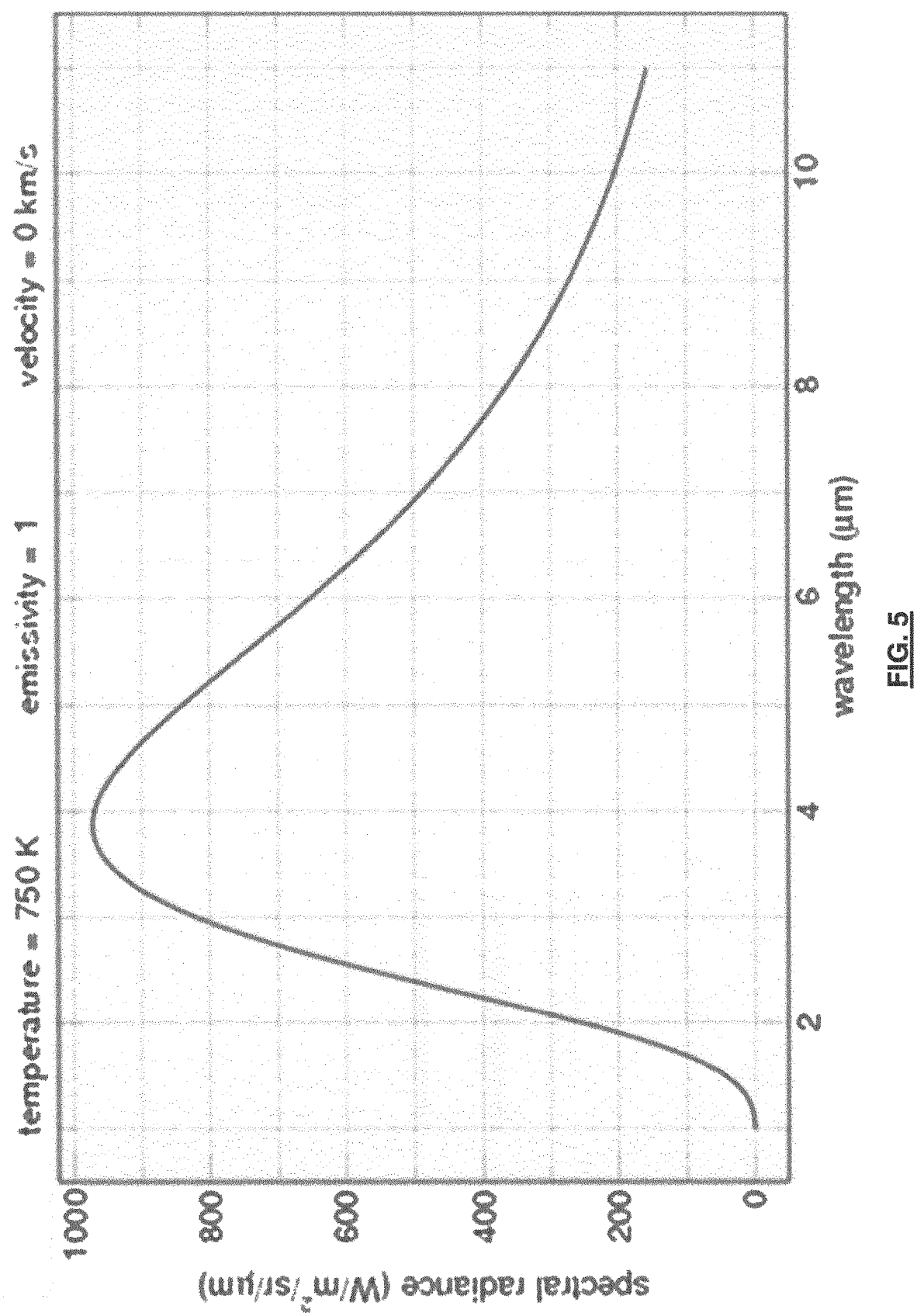
FIG. 5 depicts a graph of a blackbody spectrum at 750K.

As mentioned, the pellicle 19 may heat up to a relatively high temperature (of the order of several hundred degrees) compared with temperatures in other parts of the lithographic apparatus LA. FIGS. 4 and 5 show blackbody emission spectrums for room temperature (i.e. 300K) and approximately 450 degrees Celsius (i.e. 750K) respectively. The graph in FIG. 4 shows wavelength against spectral radiance for a temperature of 300K which has a particular shape between 2 and 8 μm and the graph in FIG. 5 shows wavelength against spectral radiance for a temperature of 750K which has a different shape between 2 and 8 μm. Taking this into account, the pellicle 19 may have a clearly distinguishable emission spectrum between e.g. 2 and 8 μm when it is at the raised temperature.

As mentioned above, in an embodiment, the pellicle 19 is in the radiation beam exposure position in the lithographic apparatus LA (in situ) and when the radiation beam B is switched on, the radiation beam B is incident on the pellicle 19. The sensor 26 can measure the temperature or temperature profile of the pellicle 19 in this situation. Therefore, a real-time, non-contact, in situ, temperature measurement of the pellicle 19 may be provided.

The IR sensor 26 may measure IR emission in bands of wavelengths which are dependent on the particular sensor used. Examples of IR sensors 26 that could be used are a Schottky barrier metal-silicide detector, or a B—Si junction detector.

In order to determine the temperature of the pellicle 19 to a sufficient accuracy, it may be enough to directly measure intensity of the IR radiation of any wavelength band in e.g. the 2-3 μm band or the 4-5 μm band. A Schottky barrier metal-silicide detector or a B—Si junction detector may be used to measure in this wavelength band. Using the information of the spectral radiance in the wavelength band measured, and knowing the blackbody spectrums, such as those shown in FIGS. 4 and 5, the temperature of the pellicle 19 can be determined. In other examples, the IR sensor 26 may be configured to measure the intensity of the IR emission in a wavelength band of one or more selected from, e.g., 2-8 μm, 2-7 μm, 2-6 μm, 2-5 μm, 2-4 μm, 3-5 μm, 3-6 μm, 4-6 μm and/or 5-6 μm.

The IR sensor 26 may also measure an IR emission differential to determine the temperature of the pellicle 19. An example differential IR emission measurement may be to determine the ratio of intensity in a 2-3 μm wavelength band to a 6-8 μm wavelength band. There are several options for IR sensors 26 that could be used for the band around 2 μm and the band around 6 μm. For the band around 8 μm, a biased Schottky barrier metal-silicide photodiode may be used. In other examples, different wavelength bands may be used for the differential measurements.

The IR sensor 26 may be a photodiode that is configured to provide a bias voltage that is scannable to establish the IR emission spectrum. For example, a tunable biased Schottky barrier photodiode (singular or multiple photodiodes) may be used for the temperature measurements. These may be used by scanning the bias voltage to establish the emission spectrum, and calculating the temperature from the curve of spectral radiance versus wavelength. As the bias voltage is in the order of 1-10 V, such a bias voltage scan can be applied very rapidly, allowing for temperature measurements at a rate of well above 1 kHz to allow real-time 2D thermal imaging of the pellicle 19.

An IR-driven LPP source may not interfere in the wavelength ranges mentioned above. For example, a $CO_2$ laser has a wavelength at 10.6 μm and a Nd-YAG laser has a wavelength at 1 μm. In other examples, the apparatus may include a filter (not shown) for filtering out radiation from the radiation beam B. This may allow the sensor 26 to be positioned in more locations, such as next to, or in, the path of the radiation beam B.

In use, the pellicle 19 moves past the radiation beam B in the direction of the arrow 20 at a relatively high speed. This would normally mean ~kHz acquisition and control rates may be required, which would increase complexity of the apparatus. However, the properties of the pellicle 19 do not change rapidly in scan direction, so the measurement does not necessarily need to be fast enough to track the variation in scan direction. That is, viewing an image which covers an area of the pellicle in the scan direction, e.g. this may be a 'blurred' image due to the movement of the pellicle 19, will be enough to determine any potential issues with the pellicle 19. Therefore, an acquisition rate of 10 Hz may be considered acceptable. In other examples, a data acquisition rate greater than 10 Hz, such as approximately 1 kHz, or above 1 kHz, may be achieved, which would be beneficial as there would be increased accuracy.

The sensor 26 may be located within the lithographic apparatus LA, i.e. within the vacuum sealed housing of the lithographic apparatus LA. As mentioned above, in an embodiment, the lithographic apparatus LA includes a pupil facet mirror device 11 which is a pupil facet module (PFM). The sensor 26 may be located next to, or in, the PFM, desirably in the center of the PFM. This utilizes a location which was intended for illumination monitoring but may not be in use. This location has an advantage of being field-serviceable and equipped with electrical connections and cooling. This location also has a full field of view of the entire pellicle 19.

The sensor 26 may be configured to carry out spatially resolved thermal imaging or integrated average temperature measurement. Spatially resolved thermal imaging would be beneficial to distinguish different locations over the pellicle 19 (which would be important if pellicle 19 properties change significantly over the area of the pellicle 19 in view—but this would then also require fast acquisition rates of ~1 kHz to prevent blurring from scanning), while integrated average temperature measurement is easier to achieve and allows for faster measurement.

The hot spot 24 is expected on the pellicle 19 to a certain extent because the radiation beam B heats up the pellicle 19 as described above. The sensor 26 may be able to look at localized hot spots within the hot spot 24. This means that local areas of concern within the hot spot 24 can be identified which could indicate potential rupture areas.

In other examples, the sensor 26 may be located elsewhere in the lithographic apparatus LA, as long as line-of-sight can be realized towards the pellicle 19. The sensor 26 may be located outside of the radiation beam B path. The sensor 26 does not need to be in direct line of sight with the pellicle 19. For example, IR radiation may be reflected off one or more surfaces in order to reach the IR sensor 26. A limited measurement field can be sufficient, especially when combined with the known absorption profile of the pellicle 19.

The IR radiation may pass through one or more substantially transparent layers to reach the IR sensor 26. That is, there may be one or more IR windows (not shown) created in the apparatus to enable the temperature measurement. There are components of the IR sensor 26, such as electronics, rubber, etc., which could affect the function of the lithographic apparatus LA, whether through interference or contamination with particles. Thus, it is beneficial to encase the IR sensor 26 in a box while still allowing the IR radiation to be able to pass through to the IR sensor 26. In other examples, the IR sensor 26 could be located outside the housing of the lithographic apparatus LA. That is, the IR radiation would need to be guided outside the housing through the interface between the vacuum inside and the non-vacuum outside.

The measurement of the temperature or temperature profile of the pellicle 19 can be used to provide information on a condition associated with the pellicle 19. That is, the temperature or temperature profile of the pellicle 19 is indicative of a condition of the pellicle 19. The condition associated with the pellicle may be one or more selected from, e.g., lifetime of the pellicle, integrity of the pellicle, a defect in the pellicle, a local transmission change of the pellicle, a particle located on the pellicle, a stain on the pellicle, a deformation of the pellicle, an impending rupture of the pellicle, a rupture of the pellicle, and/or the presence of the pellicle. These conditions may be considered to be generally defining the pellicle "health".

The temperature measurement provides a way to determine if there are defects in the pellicle 19 such as local transmission change, a particle, a stain or a deformation such as wrinkling, sagging or bulging of the pellicle 19 over time due to gradual loss of pre-tension in the film caused by slow material micro-structure changes. Some of these can be thermally driven changes or slow etching by EUV generated plasma surrounding the pellicle 19, but can be used as predictive signals of impeding pellicle 19 failure or rapid aging of pellicle 19 material.

This is significant because, as mentioned above, a timescale of the heating of the pellicle 19 by the radiation beam B is in the order of milliseconds due to the very low thickness and heat capacity of the pellicle 19, which can lead to failure of the pellicle 19 at a temperature above e.g. ~450 degrees. Previously, this meant that there was a limit on the maximum power level at which the pellicle 19 could be used, e.g. ~50-150 W, which meant the pellicle 19 was a limiting factor in machine productivity.

Production tolerances and variations across pellicles 19, and variations of film properties over the pellicle 19 lifetime, also combine to make the exact actual power limit difficult to predict. In addition, there has previously been no accurate power measurement at patterning device MA level. Despite all careful process development, the pellicle 19, under EUV load, can degenerate faster than the predicted lifetime and may lead to rupture in the lithographic apparatus LA (likely while in the radiation beam B exposure position), which affects machine availability.

This all meant that the power of the radiation beam B was previously set conservatively, i.e. set at such a level that the loss of the pellicle 19 and the patterning device MA could be avoided. This could have a high throughput impact of the order of ~20-30% (~25-35 wph).

Measuring the temperature of the pellicle 19 using the sensor 26 allows an assessment to be made on the condition of the pellicle 19. For example, if there is an unexpected or very rapid temperature increase in a specific location, this could be an indication that the pellicle 19 is about to rupture. As another example, a change in the measured temperature of the pellicle 19 may indicate that the pellicle 19 has deformed in a particular location. The pellicle 19 should be flat but it can be determined from the temperature of the pellicle 19 if the pellicle 19 is bulging or sagging, i.e. it is being deflected.

A further example may be that local rupture risks such as particles or other defects, which might lead to highly local temperature excursions and resulting pellicle 19 failures, may be detected. The temperature profile of the pellicle 19 may provide degeneration data of the pellicle 19. This may be provided in the form of a pellicle health degeneration report. A warning may also be triggered under predetermined conditions so that mitigating action may be taken to avoid a costly pellicle 19 rupture. This may be due to e.g. fast deviation in the IR image. The pellicle health degeneration report and/or the warning may be activated automatically.

The sensor 26 and measurement of temperature using, e.g., IR emission radiation from the pellicle 19 may also be used to indicate the presence of the pellicle 19. The presence of a pellicle 19 can be considered to be a condition associated with a pellicle 19.

When the radiation beam B is incident on the pellicle 19 as shown in FIG. 3, it heats up to a relatively high temperature of several hundred degrees Celsius as mentioned before. With the sensor 26 viewing the location where the radiation beam B intersects with the pellicle 19, and the pellicle 19 in position, the sensor 26 should measure a temperature of several hundred degrees. When the sensor 26 does not measure a temperature corresponding to the expected temperature of the pellicle 19 when the radiation beam B is incident on it, then it is apparent that there is a loss of the pellicle 19. This is because the patterning device MA may be at approximately room temperature (+/−10K) and thus the temperature difference would be apparent against this background. This loss of the pellicle 19 is immediately detectable.

For example, when the pellicle 19 is present, the IR sensor 26 may measure the spectral radiance in the wavelength band which corresponds to a blackbody spectrum for a temperature of 750K as shown in FIG. 5. If the readings do not show this, and they instead indicate a blackbody spectrum for a temperature of 300K as shown in FIG. 4, then the pellicle is no longer present. For example, if the IR sensor 26 is measuring IR emission radiation in the 2-3 µm wavelength band, and there is a loss of emission in the 2-3 µm band, then this signifies that there is a loss of the pellicle 19. Other IR wavelength bands may also be used but 2-3 µm may be beneficial due to existing standard detection methods.

This concept only requires a partial field of view of the pellicle 19 and does not require a full field of view of the pellicle 19. This is because a pellicle failure will likely destroy the entire pellicle 19.

If the temperature measurements indicate that the pellicle 19 is not present or not intact, and other information indicates that the pellicle 19 should be present, then it is flagged that the pellicle 19 has failed. The other information that may indicate that a pellicle 19 should be present may be based on either patterning device MA information or other pellicle detection schemes (such as TIS-based pellicle detection and/or Loadlock-Pellicle-Detection and/or Pellicle-Front-Side inspection). Knowing that the pellicle has failed, especially when the indication is immediate, allows mitigating action to be taken.

Upon lack of detection of a pellicle thermal signal, while a pellicle should be there based on other information, the radiation beam B may be stopped. That is, no more EUV pulses will be generated when it is determined that the pellicle 19 is not present or not intact. Preventing continued EUV irradiation will prevent radiation-induced reactions of the pellicle 19 particulates and flakes on the patterning device MA and lithographic apparatus LA. This increases the likelihood of successfully cleaning the patterning device MA after a pellicle failure event.

In other examples, the radiation beam B may be stopped or further pulses may be prevented depending on other conditions associated with the pellicle 19, such as impending rupture, lack of integrity of the pellicle or any other relevant condition.

In other examples, radiation measured by the sensor 26 may also be used as learning database to predict pellicle failures in the future. Particular temperatures or temperature profiles which result in a failure of a pellicle can be stored and used in the future to help avoid pellicle failures by triggering a warning that an impending rupture of the pellicle may occur.

In another example, the hot spot 24 shown in FIG. 2 may be formed from a particle located on the surface of the pellicle 19. The pellicle 19 can be more tolerant to contamination by small particles than the patterning device MA pattern 21. However, pellicles 19 can become so contaminated, or have a large enough particle, that the resulting lithography is compromised. Although the particle (or particles) on the pellicle 19 is out of focus it is desirable to be able to detect it.

In addition, the particle (or particles) on the pellicle 19 absorbs the energy from the radiation beam B. As mentioned above, the pellicle 19 is relatively thin (e.g. less than 100 nm) and therefore is limited in the amount of heat that can be conducted away. Thus, a particle on the pellicle 19 can become relatively hot, and this local non uniform heating of the surface of the pellicle 19 may generate local stresses in the film, and may result in a ruptured pellicle 19. A ruptured pellicle 19 above the patterning device MA may result in significant down time for recovery and can distribute particles throughout the optical system.

As shown in FIG. 3, the sensor 26 is mounted, as before, in such a manner so as to capture the thermal image of the radiation 28. A particle on the pellicle 19 is exposed to the actinic radiation of the radiation beam B. The particle heats up significantly more than the surrounding material of the pellicle 19. If the sensor 26 is aimed at the actinic radiation intersection with the pellicle 19, the radiation 28 from the particle would be significantly greater than the material of the pellicle 19. The pellicle 19 to particle temperature differentials may be approximately 200 degrees Celsius. Since the particle has a higher temperature than the cooler pellicle 19 background, the particle can be detected. That is, the particle can be located on the pellicle 19 by identifying a contrast between the (IR) radiation being received from the particle and the pellicle 19. A size of the particle may not be critical but it is desirable to detect any impending thermal hot spot which puts a pellicle 19 at risk.

Figure 6:
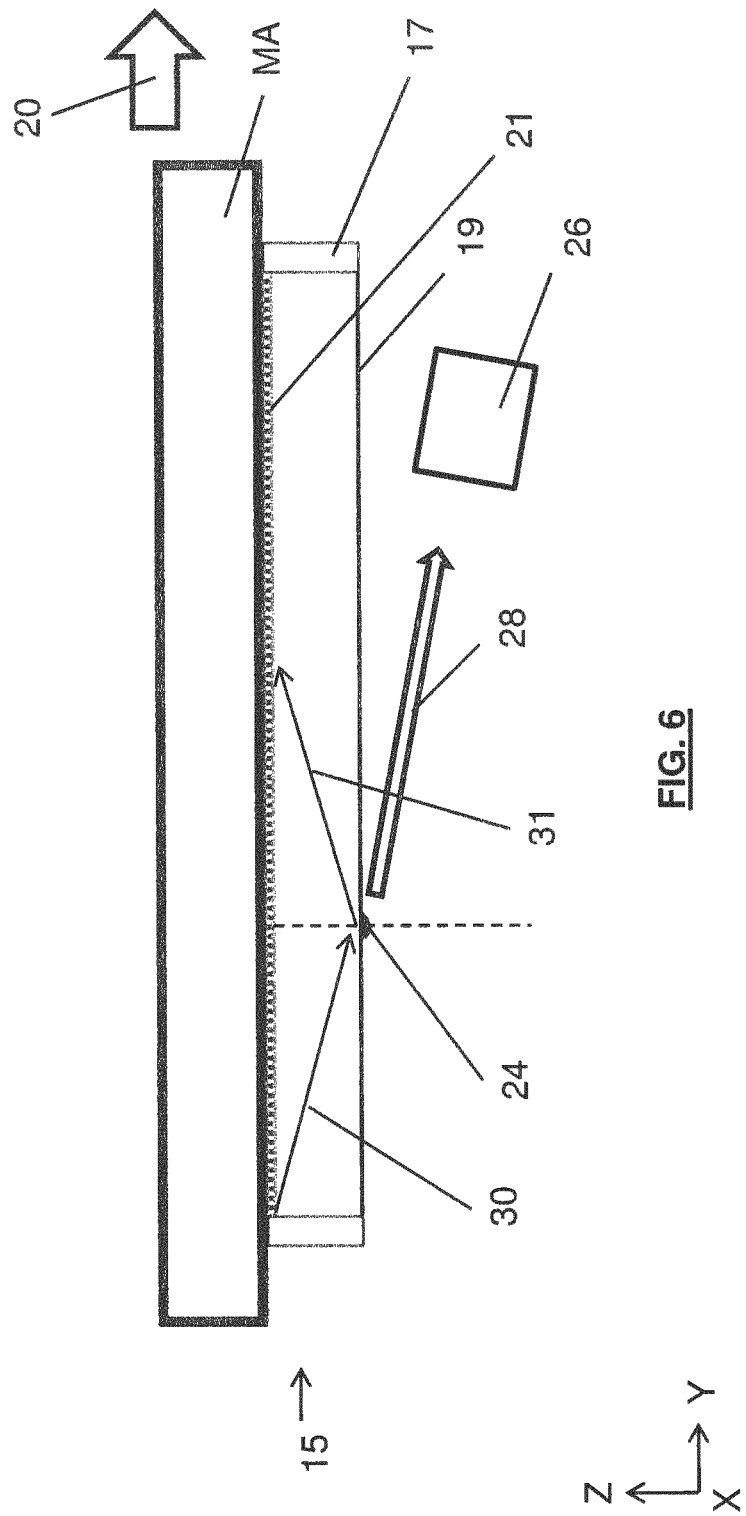
FIG. 6 schematically depicts a side view of a pellicle assembly, a patterning device and an IR sensor.

The patterning device MA may heat up as well, but, as shown in FIG. 6, mounting the IR sensor 26 at a high angle of incidence suppresses IR emissions (depicted by arrow 30) from the patterning device MA directed towards the IR sensor 26. This is due to the fact that the IR emissions of the patterning device MA would have a high angle of incidence to the pellicle 19 (i.e. the angle with respect to the normal to the pellicle 19), and would be reflected back towards the patterning device MA (the reflected IR emissions being depicted by arrow 31). The IR emissions of the patterning device MA may have an angle of incidence to the pellicle 19 of at least 45° (degrees), 50°, 55°, 60°, 65°, 70°, 75°, 80°, or 85°.

In this manner the IR imaging will be primarily limited to IR emissions from the front side of the pellicle 19. The pellicle 19 and patterning device MA transmission will follow Fresnel's law, which drops below 20% at 80 degrees. This combined with the pellicle 19 reflectance of 40%, and absorption, results in suppressed patterning device MA imaging. Additionally, since the patterning device MA is cooled, there should be minimal IR emission 30 from the patterning device MA to begin with.

The IR sensor 26 may be located at an angle of incidence with respect to the pellicle 19 (i.e. the angle with respect to the normal to the pellicle 19) of at least 45° (degrees), 50°, 55°, 60°, 65°, 70°, 75°, 80°, or 85°. The angle of incidence is not only significant for the detection of a particle on a pellicle 19 but can be useful in detecting other conditions associated with a pellicle 19. Although this example uses in situ detection of pellicle 19 hot spots 24 generated by particle heating, in other examples, the pellicle 19 hot spots 24 may be generated by other means.

The sensor 26 may image the entire pellicle 19 at once, or image a segment of the pellicle 19 at any given time, forming a composite image as the patterning device MA and pellicle 19 is scanned back and forth for exposures. Thus, an image can be formed wherein, e.g., the heated particle stands out.

The particle on a pellicle 19 can be detected while the pellicle 19 is in the radiation beam B exposure position, and desirably, when the radiation beam B is incident on the pellicle 19. This may be due to detecting a thermal hot spot 24 caused by the particle heating up on the pellicle 19. The detection of this condition associated with a pellicle 19, e.g., a particle on a pellicle 19, is useful in reducing machine down time as damage of the pellicle 19 can be avoided by taking mitigating actions.

In an embodiment, knowing the actual temperature of the pellicle 19 in real-time enables a resolution of the throughput-vs-lifetime conundrum, as driven by the uncertainties in power limit for any specific pellicle 19 and the lack of absolute incident power measurements at pellicle 19 level. As mentioned above, these uncertainties are compounded by variability in the pellicle 19 itself with respect to local material properties and its variation with time, defects etc.

Real time, in situ, temperature measurements of the pellicle 19 may be used to actively control exposure radiation power (i.e. the power of the radiation beam B) to allow the pellicle 19 to reach the highest allowed (measured) temperature, but not beyond this level. That is, in an embodiment, a feedback control loop may be used to control the power of the radiation beam B that is incident on the pellicle 19 based on the signals related to the temperature measurements of the pellicle 19.

A reduction in power of the radiation beam B reduces the throughput of substrates W per hour. The feedback loop can enable use of the lithographic apparatus LA to a higher or highest safe level of throughput.

Instead of having to set the power of the radiation beam B to a level that takes into consideration the uncertainties in the variability of the individual pellicles 19, such that the risk of a rupture of a certain pellicle 19 is low, the power level of the radiation beam B can be changed according to the particular pellicle 19 in use. For example, if the sensor 26 measures that the temperature of the pellicle 19 is raised or increasing too rapidly above predetermined conditions, then the power of the radiation beam B can be reduced to avoid any damage to the pellicle 19. On the other hand, if the temperature measurements are below predetermined conditions, or are normal, then the power of the radiation beam B can be increased to increase the throughput of substrates.

The power of the radiation beam B may be actively controlled, based on the temperature measurements from the sensor 26, to maintain the pellicle 19 at a predetermined temperature.

The allowed power for a particular pellicle 19 may be determined before exposure of the pellicle 19 to the radiation beam B. This may be done for example during the patterning device MA and substrate W alignment procedure or using a detected calibration of maximum power. This can be done for a patterning device MA and pellicle 19 pair as the pellicle 19 variability is important when it is located with the patterning device MA.

In some cases, wavelengths other than EUV are used in off-line pellicle testing which makes power limit matching within ~1% (1 wph) very difficult. Use of the temperature measurements in the lithographic apparatus LA relaxes requirements on matching off-line pellicle 19 tests to lithographic apparatus LA conditions.

The feedback control of exposure beam power (the radiation beam B power) can also be used when detecting particles on the pellicle 19 using the temperature method.

As an alternative to controlling the exposure beam power (the radiation beam B power) to balance throughput with machine/patterning device MA damage, the real time, in situ, temperature measurements could be used to drive split-exposure schemes. Split exposure schemes may be activated automatically. Split-exposure schemes can be used to prevent pellicle 19 and/or particles reaching their peak temperature by scanning faster over the patterning device MA (and correspondingly more often to maintain same dose-to-size). If the speed of the scan is increased then the substrate W may not receive enough energy to be exposed. In this case, another scan may be required which increases the time to expose the substrate W.

However, activating a split exposure in this way can result in higher net throughput of substrates W when compared against simply reducing exposure beam power. This is because the split exposure scheme is only activated when required and having a higher exposure beam power generally will mean that the throughput of substrates W will be quicker.

Furthermore, having knowledge on when the split exposure scheme should actually be used means that a split exposure scheme, which actually reduces the speed of throughput of substrates W, is not used unnecessarily. This again increases the overall number of substrates W that can be exposed in a given time.

Detection of a temperature issue means that any pellicle 19 lifetime issues or defects leading to rupture of the pellicle 19 can be detected before the pellicle 19 is ruptured. This means that interruption of the process of exposing substrates W (for example to replace a damaged pellicle or clean up a patterning device MA) can be avoided, which saves cost and time.

Although the above description has been concerned with temperature measurements in a lithographic apparatus LA, in other examples, the pellicle 19 may not be located in the lithographic apparatus LA when the measurements are taken. For example, the pellicle 19 may be located in a pellicle test stand. In other examples, the temperature measurements could be used in a patterning device MA (e.g., mask) inspection apparatus to determine defects on a patterning device as described in more detail later.

In other examples, the sensor which is configured to measure a property associated with the pellicle 19 may not be an IR sensor but may be another form of sensor. For example, the property associated with the pellicle 19 may be capacitance and the sensor may be a capacitance sensor.

FIG. 7 shows a top view of an exemplary capacitance sensor 32 which is integrated into a base plate 34 of a pellicle carrier 35, also known as an EUV inner pod (EIP) in the context of an EUV apparatus. Although a pellicle carrier has been referred to, embodiment of the invention may be equally applicable to a reticle carrier (EIP) and so any instances of a pellicle carrier mentioned may be considered to also cover a reticle carrier where applicable. The pellicle carrier 35 may be in the form of a box which can be closed and sealed to protect the components within. The base plate 34 has a cut out 36 for a pellicle (not shown) and the pellicle carrier 35 is used for safely transporting the pellicle. The pellicle may be the pellicle 19 of FIGS. 1-3 and 6. The capacitance sensor 32 includes at least one sensing area 38 and may contain a guard 40. The guard 40 helps to isolate disturbances but is not essential. The capacitance sensor 32 may be located in the center with respect to the base plate 34. However, this location is not essential as the capacitance sensor 32 may be at any position with respect to the pellicle. If a pellicle fails, due to pretension in the film, it will no longer be suspended. Therefore, the failure will be detected at any location over the span of the film. In other examples, the capacitance sensor 32 may not be located in the center, such as at a side of the base plate 34.

FIG. 8 is a side view of the base plate 34 of the pellicle carrier 35 which shows the capacitance sensor 32 electrically connected through electrical connections 42 to the outside of the pellicle carrier 35. There are many ways in which the capacitance sensor 32 may be implemented with one example being to measure against the pellicle surface with one sensing area 38 in the baseplate 34. In the example of FIG. 8, there are two electrical connections, one connected to the guard 40 and one to the sensing area 38. The electrical connections 42 are for driving or reading out of the capacitance sensor 32 on the outside of the baseplate 34. This means that the signals from the capacitance sensor 32 can be read when the pellicle carrier 35 is closed. The electrical connections 42 are exported to the outside of the pellicle carrier 35 and can thus be interfaced with, e.g. an in vacuum robot (IVR) or a rapid exchange device (RED). In another example, there may be two sensing areas 38 in the baseplate 34 and the pellicle may be used as an intermediate conductor between the two sensing areas 38.

The pellicle film may be measured with the capacitance sensor 32 so long as the pellicle film is conductive. By electrically contacting to the capacitance sensor 32 in the pellicle carrier 35, the integrity of the pellicle film may be measured, i.e. whether the pellicle is complete or at least partially broken. This measurement may be at any location in the flow, even without opening of the pellicle carrier 35. For example, whenever the IVR or the RED attaches to the pellicle carrier 35, the integrity of the pellicle can be measured. Knowing the integrity of the pellicle is significant as pellicles can break, and if this goes undetected then contamination of the lithographic apparatus LA and/or one or more other patterning devices MA can occur.

The use of the capacitance sensor 32 integrated into the pellicle carrier 35 means that the pellicle carrier 35 does not need to be opened to detect the condition of the pellicle. Furthermore, there is no requirement to make a window in the baseplate of the pellicle carrier such that the pellicle film could be viewed with an optical sensor. This also means that such an optical sensor does not need to be developed or used for this purpose.

One or more advantages include detection of a condition of the pellicle in many locations, prevention of damage to the lithographic apparatus LA, and/or prevention of cross contamination to one or more other patterning devices MA. Furthermore, detection of the integrity of the pellicle can be achieved without needing to include much additional hardware in the lithographic apparatus LA. Since the capacitance sensor 32 moves along with the pellicle in the lithographic apparatus LA and elsewhere, the detection can be executed in many places without building additional hardware into the lithographic apparatus LA or other apparatus for each location.

In other examples, the capacitance sensor 32 may be integrated into another part of the pellicle carrier. In other examples, the capacitance sensor 32 may be in a different location, such as within the lithographic apparatus LA in order to measure capacitance of the pellicle in situ. In other examples, the sensor that is integrated into the pellicle carrier may be a different type of sensor, such as optical (focus, triangulation), ultrasonic, acoustic, or gas flow restriction based.

Figure 9:
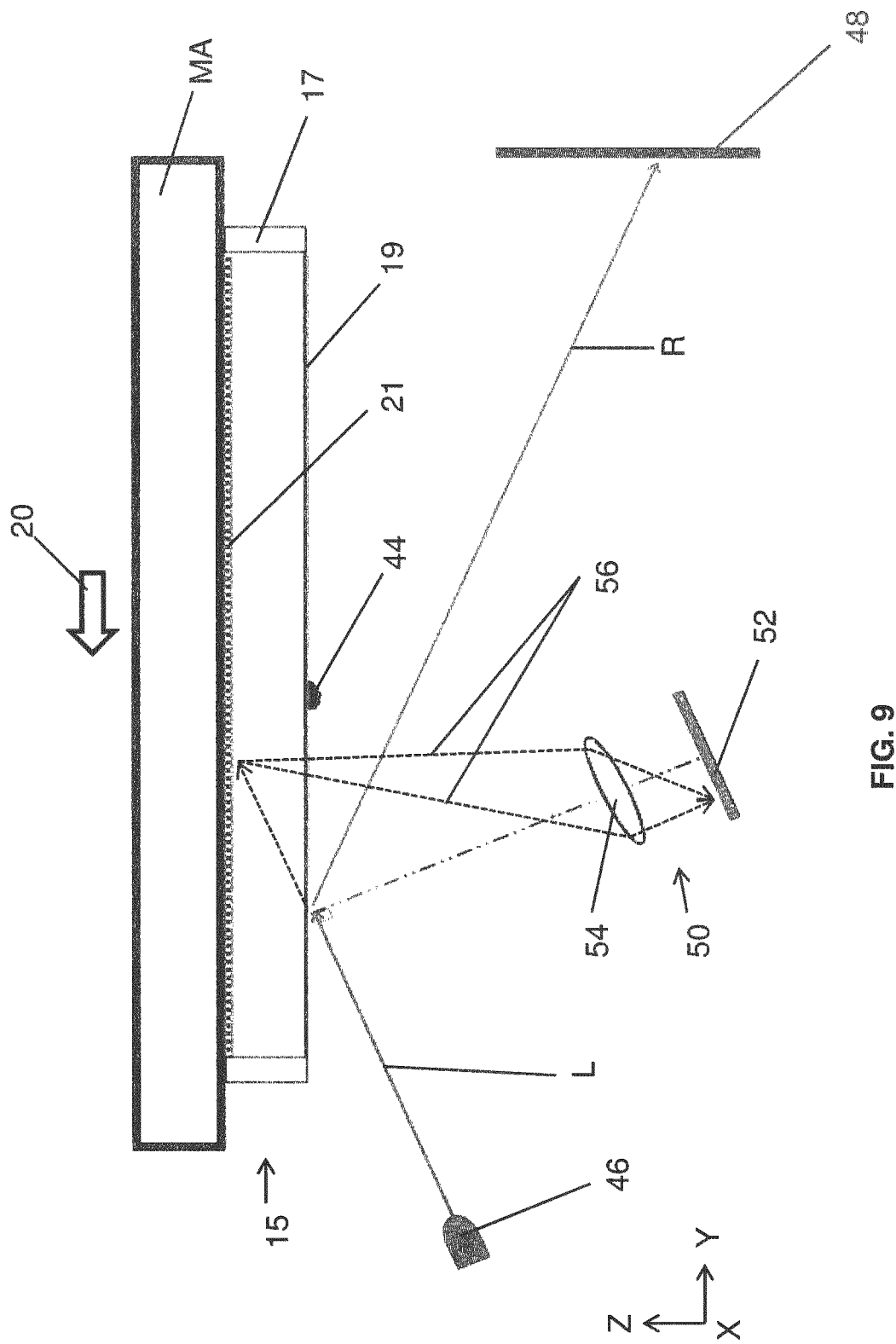
FIG. 9 schematically depicts a side view of a pellicle assembly, a patterning device, a radiation output and a radiation sensor.

FIG. 9 shows another exemplary apparatus to determine a condition associated with a pellicle. The same reference numerals are used for the same components as in previous examples. FIG. 9 shows a schematic side view of the pellicle assembly 15 and the patterning device MA. As before, the patterning device MA has a pattern 21 that provides the pattern that is imparted to the radiation beam B (not shown) after reflection from the patterning device MA.

As mentioned previously, in the lithographic apparatus LA, the patterning device MA is protected by the pellicle 19, which is out of focus with respect to a patterning device MA image of actinic radiation. By being out of focus, the pellicle 19 can be tolerant to contamination by small particles. However, a pellicle 19 can become so contaminated, or have a particle large enough (such as a particle 44 on the pellicle 19), that the resulting lithography is compromised. This may also pose a risk of pellicle 19 rupture due to non-uniform heat distribution. Therefore, it is desirable to have some means of inspecting a pellicle 19 for contamination, desirably in the lithographic apparatus LA itself. To detect the particle 44 on the pellicle 19, a reflection of illuminating radiation is used.

In FIG. 9, a radiation output 46 (e.g., a radiation source or an opening configured to provide radiation from a radiation source) provides illuminating radiation L at a relatively high angle of incidence with respect to the pellicle 19. The angle of incidence with respect to the pellicle 19 (i.e. the angle with respect to the normal to the pellicle 19) may be at least 45° (degrees), 50°, 55°, 60°, 65°, 70°, 75°, 80°, or 85°. When radiation impinges on a surface, the amount reflected, transmitted and absorbed is dictated by a material property, radiation wavelength and angle of incidence. Generally, the larger the angle of incidence, the less radiation gets transmitted.

Figure 11:
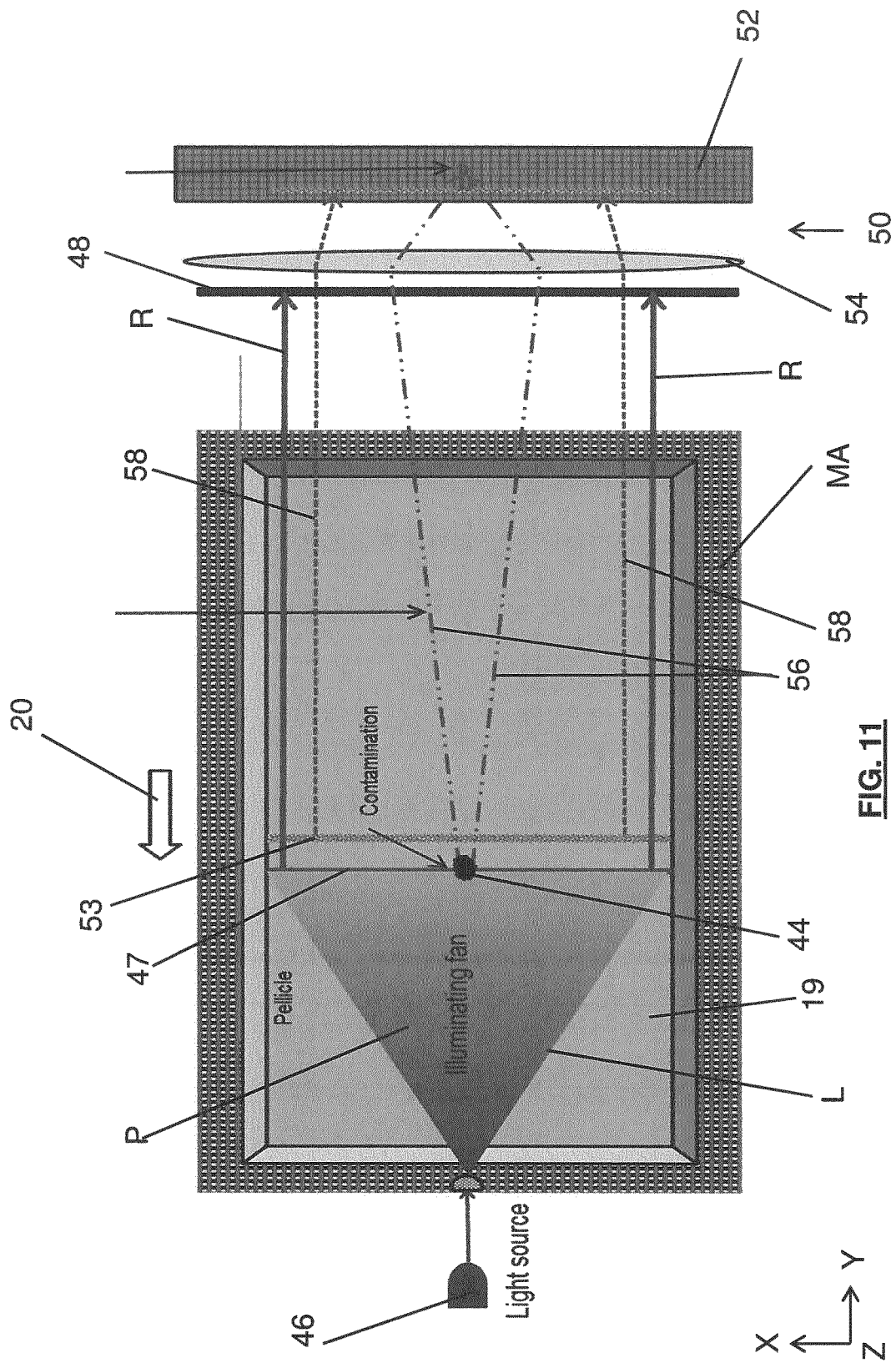
FIG. 11 schematically depicts a top view of a pellicle assembly, a patterning device, a radiation output and a radiation sensor.

The illuminating radiation L may be in the form of an illuminating plane P extending from the radiation output 46 to intersect with the pellicle 19 (see FIG. 11 for a top view of this). That is, the illumination beam is spread to form a plane P of illumination. This illuminating plane P forms a pellicle illumination line 47 when it intersects the pellicle 19 (see FIG. 11) over a predefined area. The pellicle illumination line 47 may have any suitable width as required by the circumstances. In other examples, the illumination may be over another predefined pellicle area, i.e. not necessarily a line. In other examples, the illumination line may be formed in a different way, i.e. not by an illuminating plane.

The pellicle 19 surface is relatively smooth and gives rise to specular reflection, i.e. a specular reflected beam R. That is, the non-contaminated surface of the pellicle 19 has a low diffusive reflection. The reflected beam R is directed towards a beam absorber 48 and so most of the illuminating radiation L is specularly reflected into the absorber 48. An imaging system 50 comprising a radiation sensor 52 and a lens 54 are orientated to not be in the path of the specularly reflected beam R. In this example, the radiation sensor 52 is placed perpendicular to the illuminating plane P. If the pellicle 19 is clean and free from defects (particles) then the radiation sensor 52 will not detect any radiation reflected from the pellicle 19.

However, since the pellicle 19 is substantially transparent to radiation, some of the illuminating radiation L passes through the pellicle 19 to be incident on the patterning device MA and reflects off the patterning device MA in a diffusive manner (see dashed lines 56 in FIG. 9). The illuminating plane P forms a patterning device illumination line 53 when it intersects the patterning device MA (see FIG. 11). In this case, some radiation is scattered off the pattern 21 of the patterning device MA and imaged onto the radiation sensor 52. The lens 54 focuses the radiation reflected from the patterning device MA onto the radiation sensor 52. The pellicle 19 may be a thin membrane, and may be a poor transmitter of radiation to some wavelengths.

Since the uncontaminated pellicle 19 is specular, no imaging is created from the surface of the pellicle 19. As shown in FIG. 9, if the illuminating radiation L (i.e. the pellicle illumination line 47) is not incident on the particle 44 then no image from the pellicle 19 will be formed on the radiation sensor 52.

A significant problem in pellicle 19 contamination detection is distinguishing radiation from particles 44 on the pellicle 19 and radiation diffracted from the patterning device MA features. By illuminating only a line of the pellicle 19 at any moment, and doing so at a high angle of incidence, the amount of radiation that gets transmitted to the patterning device MA is minimized. A high angle of incidence of illuminating radiation L onto the pellicle 19 reduces the risk of patterning device MA diffraction.

The higher illumination angle also maximizes the separation of the pellicle illumination line 47 image and the patterning device MA illumination line 53 image (see FIG. 11). Placing the radiation sensor 52 at a right angle to the illumination plane P will also maximize the separation of images from the pellicle 19 and the patterning device MA in the radiation sensor 52.

Figure 10:
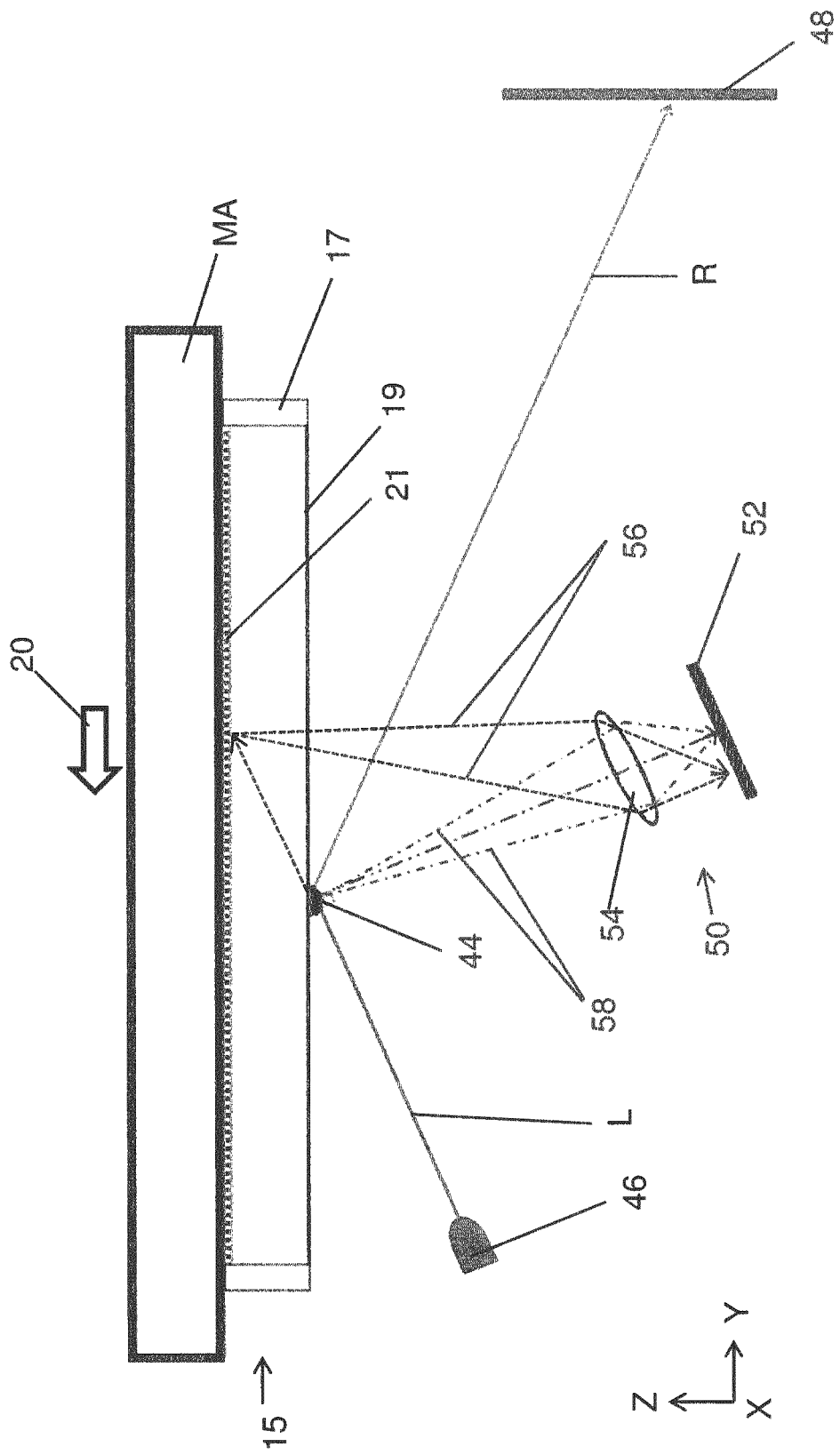
FIG. 10 schematically depicts a side view of a pellicle assembly, a patterning device, a radiation output and a radiation sensor.

As shown in FIG. 10, if the illuminating radiation L is incident on the particle 44 (i.e. the pellicle illumination line 46 falls on the particle 44) then an image from the pellicle 19 (see dotted/dashed lines 58) will be formed on the radiation sensor 52, but in a different region from any patterning device MA scattering (dashed lines 56). The patterning device MA and the pellicle 19 are scanned (in the direction of arrow 20—the y direction) which means they will move with respect to the radiation output 46. They are also scanned in the opposite direction. This means that the pellicle illumination line 47 will effectively move across the surface of the pellicle 19. Therefore, there is successive illumination of the pellicle 19 areas under the pellicle illumination line 47. This means that if there is contamination anywhere on the pellicle 19, the illuminating radiation L will shine on it during the scan and the contamination particle 44 will produce diffusive scattering which will image onto the radiation sensor 52.

FIG. 11 shows the same set up as FIG. 10 from a top view. The illumination plane P of the illuminating radiation L from the radiation output 46 is shown in FIG. 11. Also shown in FIG. 11 is the pellicle illumination line 47 where the illuminating radiation L intersects with the pellicle 19 and the patterning device illumination line 53 where the illuminating radiation L intersects with the patterning device MA. In this example, the arrow 20 shows the direction (the y direction) in which the patterning device MA and the pellicle 19 are moved for the scan. They are also scanned in the opposite direction. In other examples, the radiation output 46 could be moved instead. This may be done by sweeping the plane angle of the illuminating radiation and careful design of the imaging system 50.

By analyzing the particle 44 diffraction images on the radiation sensor 52, the size and number of particles 44 can be determined, and evaluated for potential impact on the lithographic apparatus LA performance.

The pellicle 19 could be monitored off line, e.g. either outside the lithographic apparatus, or inside the lithographic apparatus without the radiation beam B being incident on it. Alternatively, the pellicle 19 could be monitored in real time, e.g. with the radiation beam B being incident on it.

Given a particular pellicle 19 to patterning device MA separation, the pellicle 19 and patterning device MA illumination line intersections would image as dictated by this equation:

$$S = \frac{Distance_{Reticle\ Pellicle}}{\cos \theta}$$

where 'S' is the line separation which is the distance as seen by the imaging system 50 perpendicular to the illuminating plane P, 'Distance' is the distance between the pellicle and the patterning device MA, and 'θ' is the angle of incidence (illumination angle) with respect to the pellicle 19. For a 2.5 mm patterning device MA to pellicle 19 distance, at an illumination angle of 80 degrees, the line separation S would appear as a 14 mm distance.

To further reduce the risk of false detection due to patterning device MA diffraction, two radiation outputs 46 could be used which scan in opposite directions to detect common location diffraction. This is because the illumination of a specific location on the pellicle 19 from both radiation outputs 46 would illuminate different locations on the patterning device MA.

Figure 12:
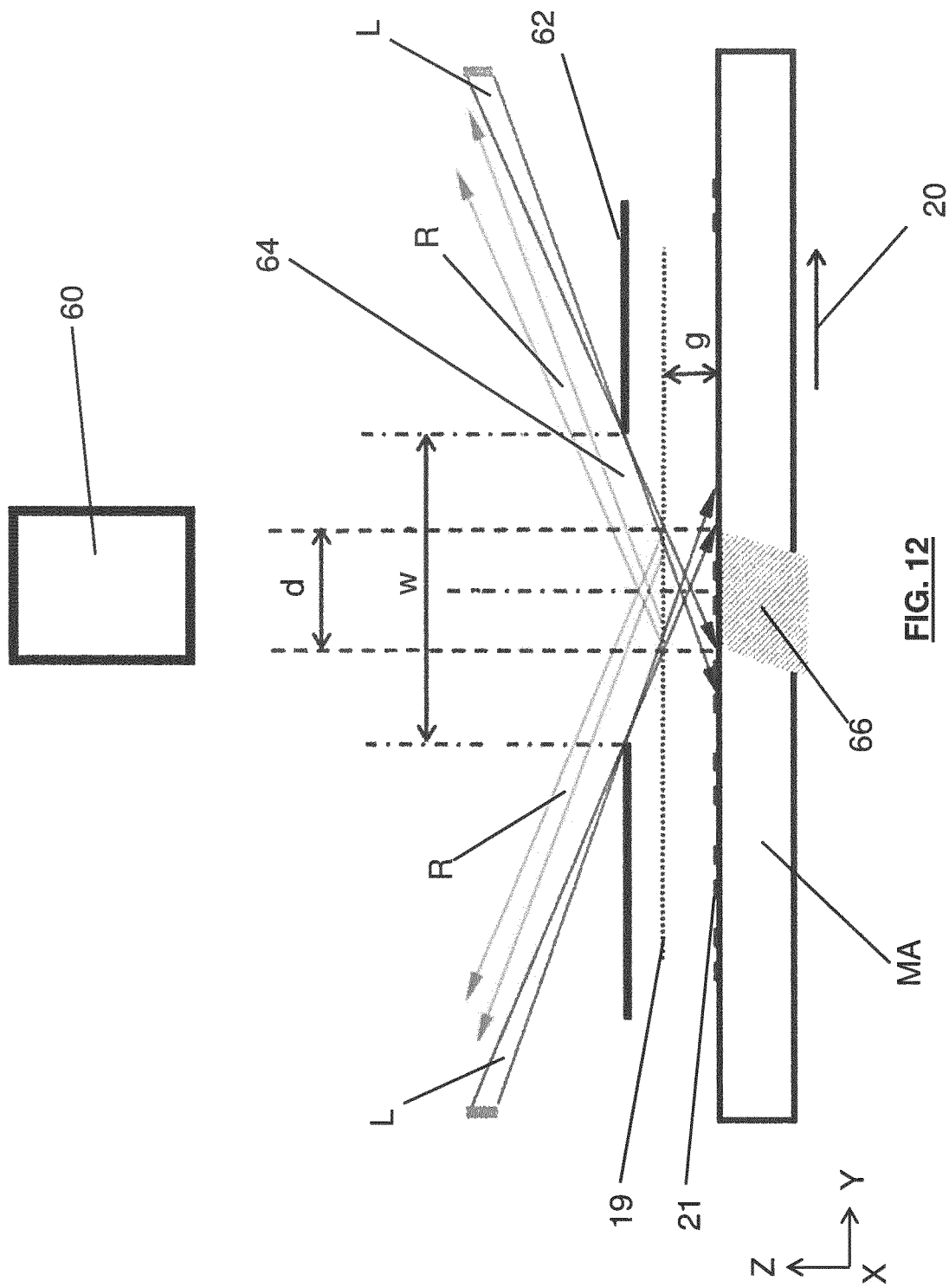
FIG. 12 schematically depicts a side view of a pellicle, a patterning device, a shadowing structure and a radiation sensor.

FIG. 12 shows another exemplary apparatus for determining a condition associated with a pellicle. The same reference numerals are used for the same components as in previous examples. FIG. 12 shows a schematic side view of the pellicle 19 and the patterning device MA. The pellicle 19 is separated by a gap g from the patterning device MA. This gap g may be 2-3 mm, or about 2.5 mm. The pellicle 19 and the patterning device MA move in the direction left to right as depicted by arrow 20, i.e. it is scanned in this direction. They may also be scanned in the opposite direction. The patterning device MA has a pattern 21 that provides the pattern that is imparted to the radiation beam B (not shown) after reflection from the patterning device MA.

There may be a particle or particles located on the pellicle 19. Such particle(s) may cause exposure defects and pose a risk of pellicle 19 rupture due to non-uniform heat distribution. To detect the particle(s) on the pellicle 19, reflections of illuminating radiation are used in a similar way as in the example of FIGS. 9-11. However, in this example, the detection of the particle(s) is carried out in a different way.

In order to detect a particle, illuminating radiation L is shone from an illumination output (e.g., source) (not shown) onto the pellicle 19. The wavelength of the illuminating radiation L is not significant as long as it can be detected. The illuminating radiation L may be shone from two different radiation outputs. The illuminating radiation L may be at a relatively high angle of incidence with respect to the pellicle 19. The angle of incidence with respect to the pellicle 19 (i.e. the angle with respect to the normal to the pellicle 19) may be at least 45° (degrees), 50°, 55°, 60°, 65°, 70°, 75°, 80°, or 85°.

Reflected radiation R from the pellicle 19 and particle(s) is captured by a radiation sensor 60 (i.e. a camera, such as a high resolution camera) which is positioned to detect the reflected radiation R. The radiation sensor 60 may be positioned perpendicular to the pellicle 19. In other examples, the radiation sensor 60 may be located in a different position and angled accordingly. By viewing this reflected radiation using the radiation sensor 60, the location of the particle(s) can be determined.

However, since the pellicle 19 is substantially transparent, some of the illuminating radiation L also passes through the pellicle 19 and reflects off the pattern 21 of the patterning device MA. Therefore, a patterning device MA pattern may be included in reflected radiation which may produce a ghost pattern detected by the radiation sensor 60. Such a ghost pattern is undesirable as it may be incorrectly considered as a defect. An additional image post-processing algorithm may be required to filter out the ghost pattern, which may not be reliable all the time.

In order to address this, a shadowing structure 62 is provided between the pellicle 19 and the radiation sensor 60 to shadow at least part of the patterning device MA while allowing the illuminating radiation L to be incident on the pellicle 19. The shadowing structure 62 has an aperture 64, which may be in the form of a slit, and has a width w that it is sized such that a pre-defined pellicle 19 area can be viewed by the radiation sensor 60 while the visibility of a patterning device pattern (ghost pattern) is substantially reduced. That is the ghost pattern is made invisible or its visibility is greatly reduced to prevent it being reported as a defect.

Due to the width w of the aperture 64, the gap g between the pellicle 19 and the patterning device MA, and the angle in which the radiation L is directed, there is an effective detection distance d where the reflected radiation R can be detected from the pellicle 19. This means that there is a shadowing area 66 for the patterning device MA where radiation cannot be reflected from and detected by the radiation sensor 60. This means that if a defect (i.e. a particle) is detected within the effective detection distance d then it is an actual defect on the pellicle 19 and not a ghost pattern from the patterning device MA.

The patterning device MA and pellicle 19 can be scanned in a continuous or stepwise mode to achieve a full surface inspection of the pellicle 19. Different inspection zones can be illuminated which can then be processed and integrated to achieve the full surface inspection.

The method of using the shadowing structure 60 and the illuminating radiation L does not depend on optical properties of the surface of the pellicle 19 or the wavelength of the illuminating radiation L. Therefore, it is versatile and can be adapted to inspect different types of surfaces.

Figure 13:
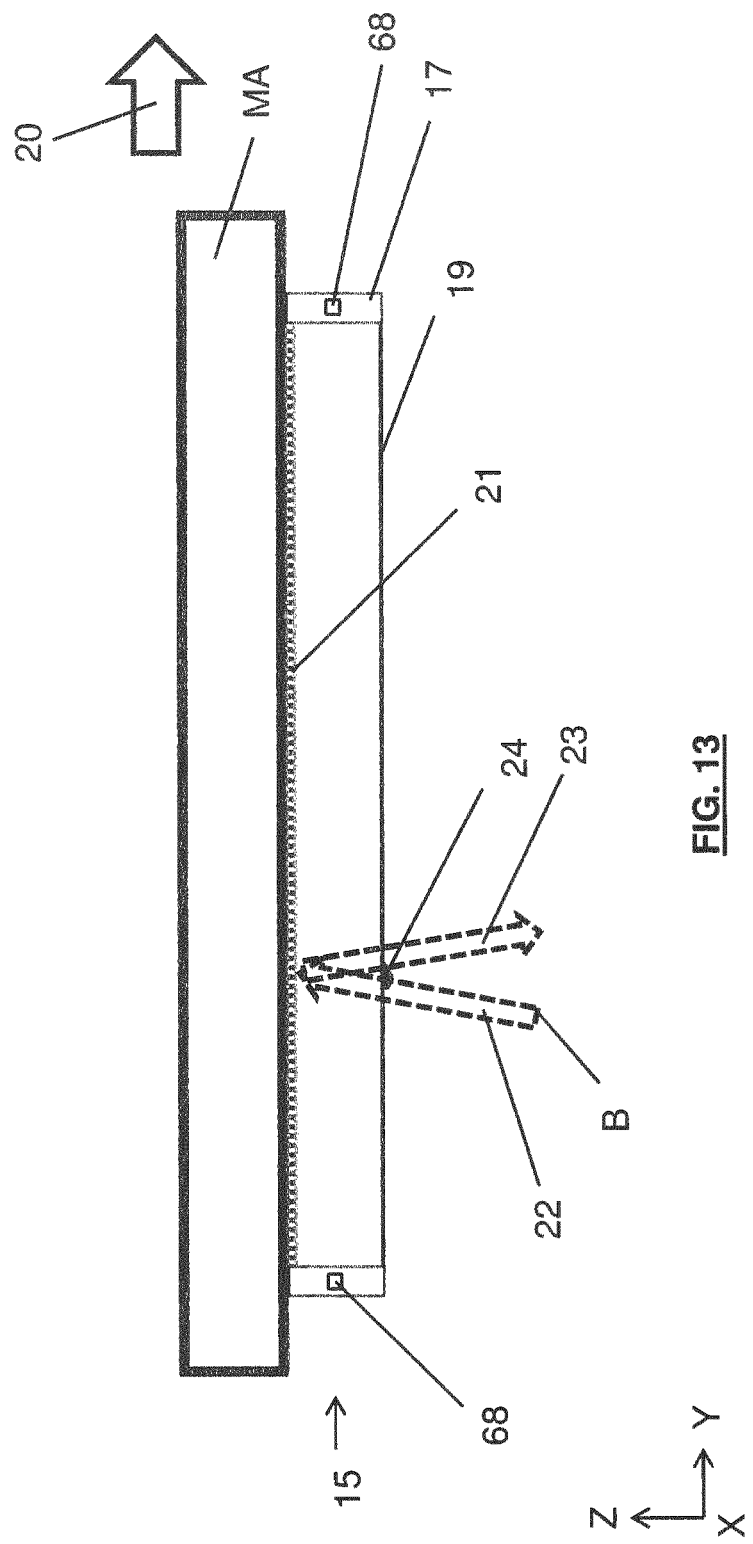
FIG. 13 schematically depicts a side view of a pellicle, a patterning device and proximity sensors.

FIG. 13 shows a pellicle assembly 15 and patterning device MA similar to as shown in FIG. 2 except, in this example, the pellicle frame 17 of the pellicle assembly 15 includes a plurality of proximity sensors embedded in the pellicle frame 17. In particular, in this example, the proximity sensors are cap-gauge sensors 68 (capacitance distance sensors). The cap-gauge sensors 68 may be miniaturized in order to fit in the pellicle frame 17. Although only two cap-gauge sensors 68 are shown in FIG. 13, there may be as many cap-gauge sensors 68 as desired. For example, one cap gauge sensor 68 may be used. However, this might not report partial breaks of the pellicle 19. More than one cap-gauge sensor 68 would be better with there being a tradeoff in cost and system complexity for increasing numbers of cap-gauge sensors 68. The cap-gauge sensors 68 may be spaced around the pellicle frame 17. The one or more cap-gauge sensors 68 and any related equipment should be located out of the patterning field. Desirably, the one or more cap-gauge sensors 68 are protected from stray radiation. A desired position for the one or more cap-gauge sensors 68 (and related equipment) is embedded in the pellicle frame 17.

The one or more cap-gauge sensors 68 are configured to detect distance to the pellicle 19. The one or more cap-gauge sensors 68 function by reporting localized changes in electrical capacitance between the respective cap-gauge sensor 68 and the target (i.e. the pellicle 19). The detecting of the distance to the pellicle 19 by the one or more cap-gauge sensors 68 allows the presence of the pellicle 19 to be checked. That is, a cap-gauge sensor 68 monitors the presence or existence of the pellicle 19 by determining if the distance between the pellicle and the cap-gauge sensor 68 has changed by a predetermined amount or if the pellicle 19 can no longer be detected by the cap-gauge sensor 68. The presence of the pellicle 19 may be considered to be a condition associated with the pellicle 19.

The monitoring of the presence of the pellicle 19 may be at regular time intervals. That is, the cap-gauge sensor 68 may determine if the pellicle 19 is present at specific time intervals. If there is any change in the pellicle 19 condition, e.g. if the pellicle 19 is no longer detected by the cap-gauge sensor 68, then this can be reported. If the pellicle 19 is not detected as being present this may indicate a rupture of the pellicle 19 or a hole in the pellicle 19. Once the pellicle 19 has been reported as not being present, then corrective action may be taken. For example, this may be turning off, or blocking, the radiation beam B, or stopping the scanning of one or more substrates W in the lithographic apparatus LA.

The one or more cap-gauge sensors 68 may be powered by a battery or batteries (not shown) located with or close to the one or more cap-gauge sensors 68. The battery may be connected to or embedded in the pellicle frame 17. The battery may be charged inductively and may be charged at regular time intervals. In other examples, the battery may be charged by other means such as by a temporary electrical connection.

The one or more cap-gauge sensors 68 may be connected to a circuit board (not shown) which may wirelessly transmit any significant detected change in the distance between the one or more cap-gauge sensors 68 and the pellicle 19 which may signal a likely pellicle 19 rupture. The wireless transmission avoids a need for any wires to be connected to each or a group of one or more cap-gauge sensors 68 and enables real time communication providing information on the condition of the pellicle 19.

The rupturing of the pellicle 19 is a serious adverse event and it may be costly and time consuming to restore the equipment. For example, the full entire lithographic apparatus LA may need to be taken down for a manual clean up service. The rupture of the pellicle 19 may occur due to several causes such as thermal, dynamic, electrostatics, etc.

Having the one or more cap-gauge sensors 68 positioned in the pellicle frame 17 and monitoring the presence of the pellicle 19 allows immediate feedback of a pellicle 19 rupture or impending pellicle 19 rupture. The lithographic apparatus LA can then be serviced faster. Furthermore, future processing of other lots of substrates W with compromised pellicized patterning devices MA can be avoided. That is, the contamination of other substrates W with particles or residue of ruptured pellicles 19 can be avoided.

The use of the one or more cap-gauge sensors 68 can allow continuous real time monitoring of the pellicle 19, e.g. when the radiation beam B is incident on the pellicle 19 in the radiation beam B exposure position. Further, using multiple detectors throughout the system to monitor the pellicle or patterning device may be avoided. A single pellicle detector for patterning devices MA (e.g., the use of the one or more proximity sensors) may provide a reduction in cost compared to implementing and running numerous sensors in various areas of the lithographic apparatus LA.

The above example is concerned with pellicle 19 detection outside of a pellicle carrier (e.g., an EIP), i.e. the pellicle detection is occurring in the lithographic apparatus LA after the pellicle assembly 15 has been removed from the pellicle carrier. However, in other examples, the one or more cap-gauge sensors 68 may be present in a pellicle frame 17 in the pellicle carrier, and pellicle 19 detection (detection of a ruptured pellicle 19) may occur in the pellicle carrier in a similar way as previously described. This may enable the prevention of ruptured pellicles being released into the lithographic apparatus LA.

In other examples, the one or more proximity sensors may be not fully embedded in the pellicle frame 17 but they may be associated with the pellicle frame 17. The one or more proximity sensors may be, for example, partially embedded, in, partially in, connected to, attached to, fixed in, moved with, located with, on or around the pellicle frame 17. In other examples, there may be only one proximity sensor in the pellicle frame 17.

In other examples, the one or more proximity sensors may be one or more induction sensors. Induction sensors may be used if the pellicle material is conductive or has a conductive coating. In another example, a laser based sensor may be used but this may involve higher system complexity when compared with using one or more cap-gauge sensors 68. In other examples, the one or more proximity sensors may be a different type of sensor, provided that they can determine a condition associated with the pellicle.

Figure 14:
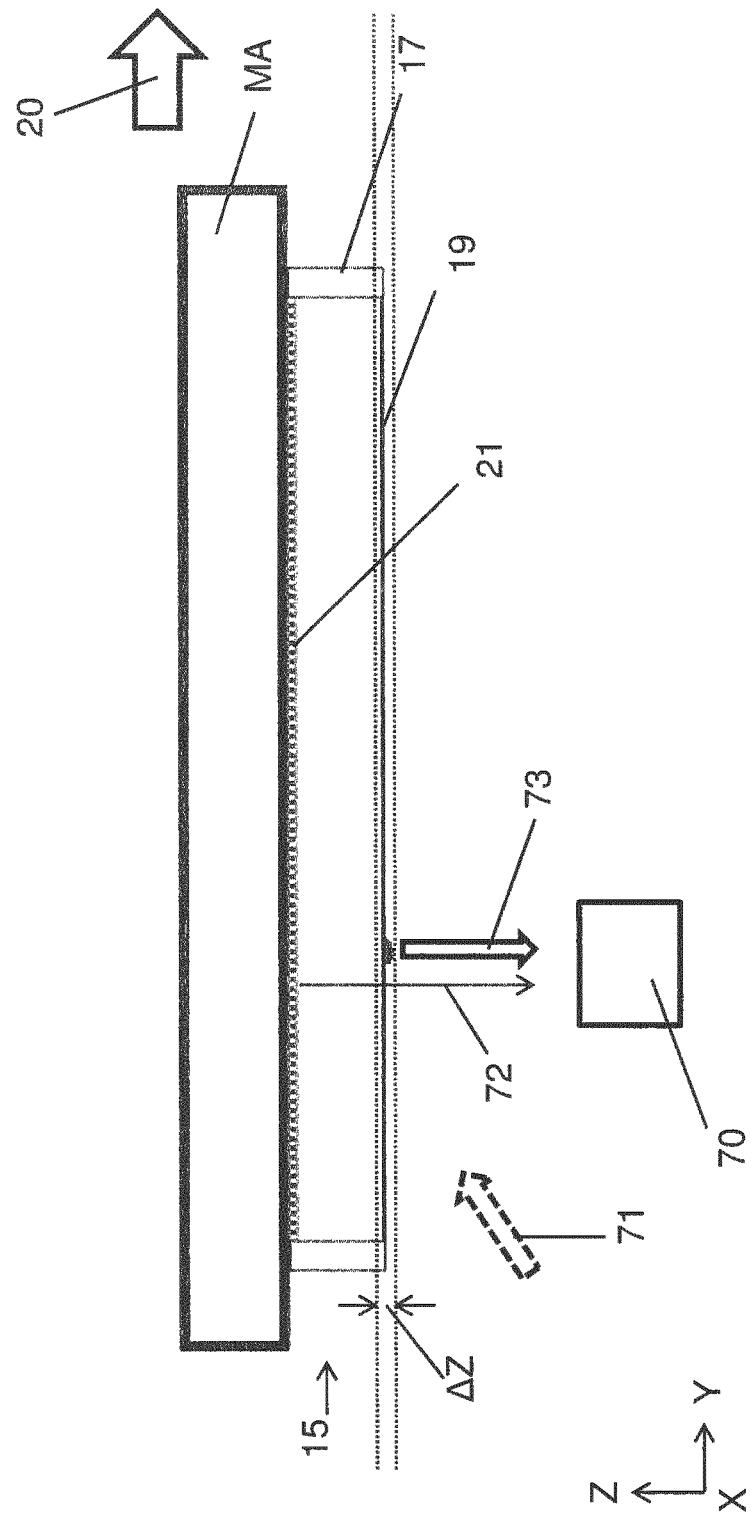
FIG. 14 schematically depicts a side view of a pellicle, a patterning device and a light field sensor.

FIG. 14 shows a pellicle assembly 15 and patterning device MA similar to as shown in FIG. 2 but there is also shown a light field (plenoptic) camera 70 positioned to have a view of the pellicle 19. The light field camera 70 is positioned to inspect the surface of the pellicle 19 when it is illuminated by radiation as illustrated by arrow 71. The radiation used to illuminate the pellicle 19 may be any visible or IR wavelength radiation for which conventional glass transmissions and camera detector quantum efficiencies are both high. Visible light may be preferred due to resolution considerations. The polarization state of the radiation may also be selected and optimized for particular patterning devices MA, but nominally may be unpolarized. The illuminating radiation may originate near the light field camera 70 and scatter and/or diffract back into the light field camera 70. The illuminating radiation angle of incidence is also a parameter that may be optimized for particular patterning devices MA (e.g., to minimize their returns to the light field camera 70).

Radiation may be reflected from the pattern 21 of the patterning device MA (see arrow 72) and radiation may be reflected from the pellicle 19 (see arrow 73). The pellicle 19 can be considered to correspond to an inspection plane, i.e. the pellicle 19 is located in the inspection plane. The pellicle 19 may be considered to be at a depth Z. However, the location of the pellicle 19 in the Z-direction may be uncertain (e.g. due to production tolerances). Thus, the inspection plane may cover a range of maximum pellicle displacement in the Z-direction. That is, the inspection plane has a range of ΔZ as shown in FIG. 14.

The light field camera 70 can capture information about the light field emanating from a surface (that is, the intensity of radiation from a surface), and also the direction that the radiation rays are traveling in space. This contrasts with a conventional camera, which records only radiation intensity. The light field camera 70 is able to reconstruct a 3D image with only one exposure. That is, in addition to the traditional 2D image, depth information is also captured. The light field camera 70 software may be used to output a 2D image file for only the Z plane corresponding to the inspection plane (e.g., the light field camera 70 only outputs intensity information arising from the inspection plane in the Z range=ΔZ).

Since depth information may be captured by the light field camera 70, the light field camera 70 may be used to obtain information (e.g., an image) from only a particular depth. Since the pellicle 19 is spaced away from the patterning device MA (e.g. by at least 2 mm), the light field camera 70 may be used to obtain information from only the pellicle 19 (i.e. from radiation reflected—see arrow 73). That is, the light field camera 70 may be used to filter only signals arising from the pellicle 19 (the inspection plane) by utilizing the depth information. Thus, radiation intensity information reflected from the patterning device MA (i.e. from radiation reflected—see arrow 72) may be filtered out.

Filtering out radiation intensity signals from the pattern 21 of the patterning device MA means that false detection of defects in the pellicle 19 (such as a particle on the pellicle 19) may be avoided. In the process of illuminating the inspection surface (the pellicle 19), the pattern 21 of the patterning device MA is also illuminated. There is a problem with trying to detect features on only one of two surfaces that are both being illuminated by the radiation (arrow 71) and imaged simultaneously. This is especially an issue with the pellicle 19, which is mostly transparent, and the patterning surface, which is fully or at least partially reflective. False detection of defects results from pattern diffraction and scattering from the patterning device MA. These signals can be significantly brighter than the signals from the particles (e.g. the size of 5 microns) that may be on the pellicle 19 and are desired to be detected.

Using the light field camera 70 to detect defects in the pellicle 19 has an advantage of eliminating the signals from sources other than the inspection plane, i.e. radiation intensity information coming from one or more other surfaces than the pellicle 19 are filtered out. This results in a more robust and reliable method of detecting defects (such as particles located on the pellicle 19). The use of the light field camera 70 also has an advantage that there is only a single object (i.e. a camera/lens) to align with any precision.

Once the intensity information from the patterning device MA reflections, etc. have been filtered out (i.e. the 2D image for only the Z plane corresponding to the inspection plane is obtained), a detection algorithm may be operated on the 2D image. This detection algorithm should provide information on any defects associated with the pellicle 19 with a small false alarm rate. This is because the intensity information from the patterning device MA (the source of false alarms) has already been eliminated. Thus, a particle detection algorithm may be operated on the signals corresponding to the inspection plane.

Figures 15, 16:
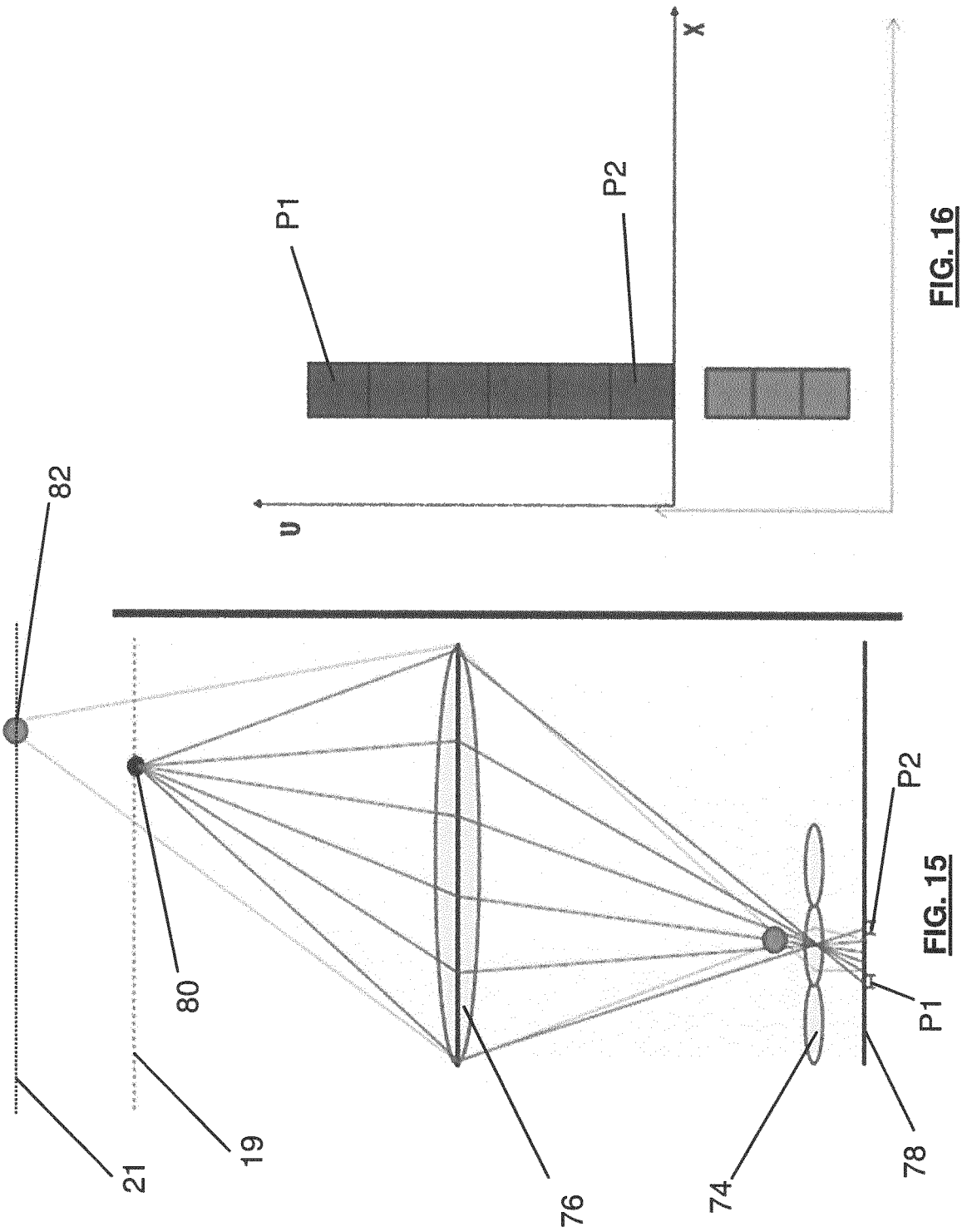
FIG. 15 schematically depicts a ray diagram of a pellicle, a patterning device and a light field sensor.
FIG. 16 schematically depicts a ray space diagram of a light field sensor showing position and angle.

The filtering of the signals from the patterning device MA may be done in any suitable way but one example may be using a method as shown in FIGS. 15 and 16. In this example, detections and segmentations are over a four dimensional space (one angle (u) and one spatial dimension (x) shown for clarity, but y and v are also available). The detections that span undesired angular ranges can be filtered out.

FIG. 15 shows conceptually how the light field camera 70 may filter out objects detected at different field depths, such as stray or diffracted radiation from the patterning device MA, that can confuse a pellicle 19 inspection. Light field (plenoptic) camera 70 may have a lenslet array 74 at the traditional focal plane from a lens aperture 76, relay optic(s), and an image sensor 78 (e.g. CCD or CMOS detector) being one lenslet focal length behind the lenslet array 74. The lenslet array 74 has a plurality of lenslets. In this set up, the lenslet size and number effectively determine the spatial resolution and the number of pixels behind each lenslet determines the angular resolution.

As shown in FIG. 15, radiation from a particle 80 on the pellicle 19 would occupy a different set of angular pixels than radiation from an object 82 (e.g., reflection from part of the pattern 21 or an object on pattern 21) of the patterning device MA. The radiation rays from the object 82 cross in front of the lenslet array 74 and then occupy a central portion on the image sensor 78. Whereas, the radiation rays from particle 80 are focused on the lenslet array 74 and then occupy a wider portion on the image sensor 78. Pixel one P1 and pixel two P2 on the image sensor 78 do not have radiation rays from the object 82 incident on them but they do have radiation rays incident on them from particle 80 on the pellicle 19.

The light field camera 70 detects position and angle and therefore depth information. A traditional camera would see radiation projection only on the x axis (see FIG. 16) and would thus confuse images from both the pellicle 19 and the patterning device MA. However, having a smaller span in the U (angle) dimension allows depth to be resolved. Angular spread (u) is shown in the top graph of FIG. 16 with pixel one P1 and pixel two P2 in FIG. 16 corresponding to pixel one and pixel two of FIG. 15. Detection algorithms may be written in 4D space and then the detections with the wrong angular spread may be filtered out or fitted out. The bottom graph of FIG. 16 represents the pixel intensity distribution in one dimension for the object 82, a feature on the patterning device MA, which is acting as contamination to the pellicle detections. In the case of direct spatial superposition, the two pixel intensity distributions will be summed by the light field camera 70. The exact distribution of radiation over these ranges will depend on the scattering and diffraction physics and materials, but the edges in the graphs of FIG. 16 can represent either true image edges or parameters such as full-width-half-maximums. A fit with one characteristic function, such as normal, tophat, Lambertian, or Voight distributions may be made but will not be able to sufficiently describe the total distribution owing to the superimposed more compact and broader angular distributions. Statistical tests with two fitting distributions will show a better explanation of the data within the errors leading to two detections, and the narrower distribution will be assigned to the particle 80 on the pellicle 19.

Image processing may be carried out by making and segmenting detections in a traditional image processing way, and then filtering out detections that span particular ranges of angle known to not correspond to the depth of interest. These detections could be subtracted, and another round of detections could then find significant features at the desired depth of interest alone. In other examples, the light field information may be exploited in different ways.

The inspection of the pellicle 19 by the light field camera 70 may be considered to be measuring a property associated with the pellicle, the property being indicative of the pellicle condition. The pellicle condition may be, for example, a particle located on the pellicle 19 or a defect in the pellicle 19, such as a hole or rupture of the pellicle 19.

Figure 17:
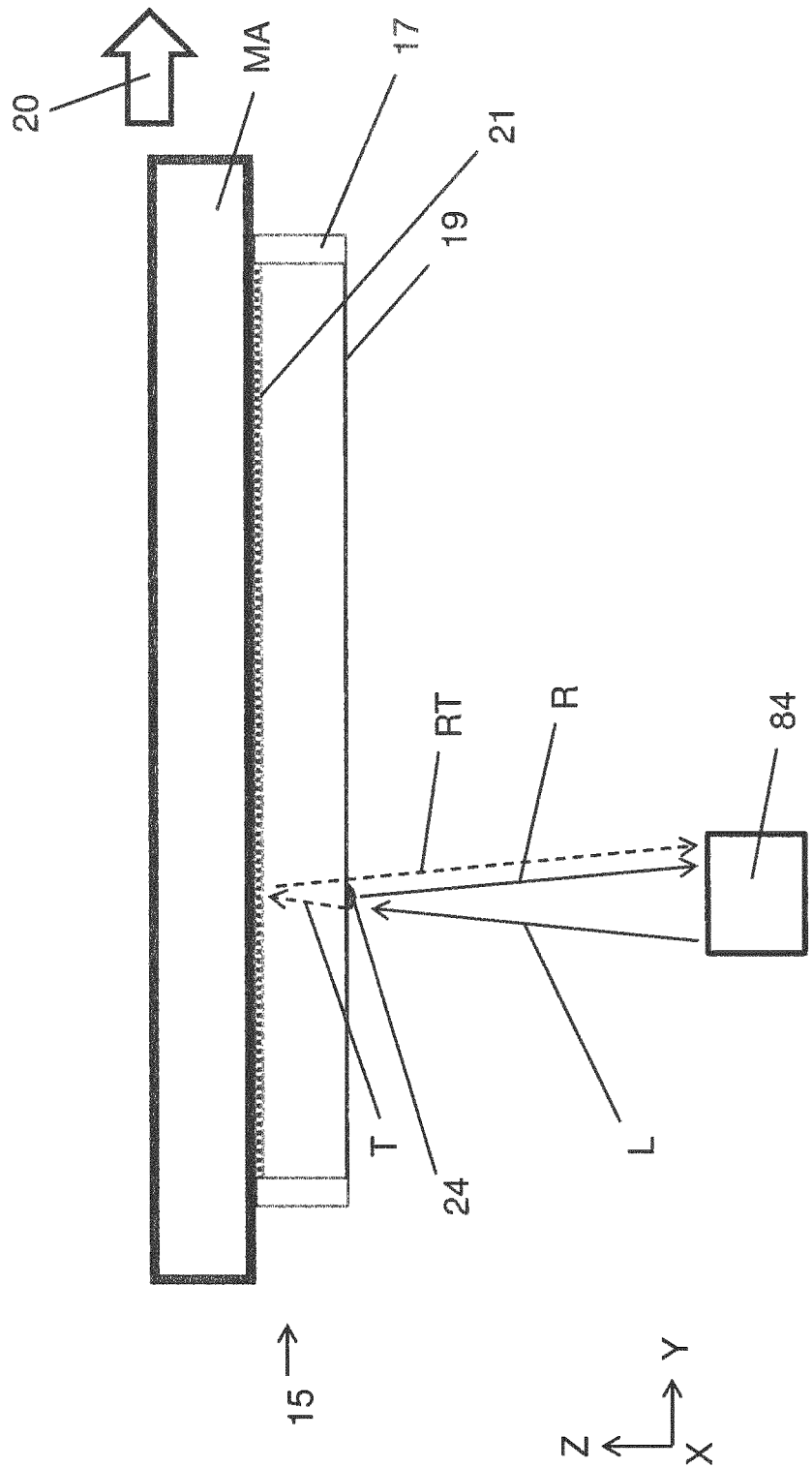
FIG. 17 schematically depicts a side view of a pellicle, a patterning device, and a radiation sensor.

FIG. 17 shows another exemplary apparatus for determining a condition associated with a pellicle. The same reference numerals are used for the same components as in previous examples. FIG. 17 shows a schematic side view of the pellicle 19 and the patterning device MA. The pellicle 19 and the patterning device MA move in the direction left to right as depicted by arrow 20, i.e. it is scanned in this direction. They may also be scanned in the opposite direction. The patterning device MA has a pattern 21 (e.g., a device pattern) that provides the pattern that is imparted to the radiation beam B (not shown) after reflection from the patterning device MA.

There may be a particle 24 or particles located on the pellicle 19. These particles 24 may cause exposure defects and pose a risk of pellicle 19 rupture due to non-uniform heat distribution. Pellicles should be inspected for particles before they are exposed in the lithographic apparatus LA. To detect the particle 24 on the pellicle 19, reflections of illuminating radiation are used in a similar way as in the example of FIGS. 9-11. In this example, the detection of the particle(s) is carried out in a different way.

In order to detect the particle 24, illuminating radiation L is shone from an illumination (radiation) output (e.g., a source) onto the pellicle 19. Reflected radiation R from the pellicle 19 and particle(s) is captured by a radiation sensor 84 (detector) positioned to detect the reflected radiation R. The illuminating radiation L may come from the radiation sensor 84 as shown. In other embodiments, the illuminating radiation L may come from a radiation source separated from radiation sensor 84. The radiation sensor 84 may be positioned essentially perpendicular to the pellicle 19. In other examples, the radiation sensor 84 may be located in a different position and angled accordingly.

By viewing this reflected radiation R using the radiation sensor 84, the location of the particle(s) 24 can be determined using the principle of scatterometry which is based on the diffuse reflection of radiation from the particle(s) being picked up by the radiation sensor 84. The illuminating radiation L is shone from a side of the pellicle 19 so that it bounces off the pellicle 19 with the radiation sensor 84 located above the pellicle 19. The angle of incidence of the illuminating radiation L should be such that the reflected radiation off the pellicle 19 does not reach the radiation sensor 84. On a perfectly flat surface, no radiation would reach the radiation sensor 84. If there is a defect relating to the pellicle 19, such as a particle 24 on the pellicle 19, the defect will reflect radiation in all directions (diffuse reflection), and this radiation will be picked up by the radiation sensor 84.

In this embodiment, the illuminating radiation L when it is incident on the pellicle 19 is collimated (parallel beam) or divergent. This allows the full pellicle 19, at least part of or the full width of the pellicle 19, or at least a substantial part of the pellicle 19, to be illuminated at once, i.e. at the same time, instantaneously. It may be desirable to measure the entire surface of the pellicle 19 at once, in one exposure, e.g. an approximate exposure area of 100 mm×140 mm. A substantial part of the pellicle 19 may be considered to be not just a local area of the pellicle 19. The width of the pellicle may be considered to be the size of the pellicle in either the x or the y direction. To illuminate the width of the pellicle 19, the illuminating radiation L may be considered form an illuminating plane to form a pellicle illumination line when it intersects the pellicle 19 over a predefined area, similar to as described in relation to FIG. 11. This means that the pellicle illumination line may effectively move across the pellicle 19 as the pellicle 19 moves in e.g. the y direction. Therefore, there is successive illumination of pellicle 19 areas under the pellicle illumination line. The pellicle illumination line may have any suitable width as required by the circumstances.

The proposed method means that the check for particles 24 on the pellicle 19 can be carried out quickly before exposure, rather than e.g. having to scan across the pellicle 19 with a small illumination spot which would take longer. In other embodiments, the illuminating radiation L may be focused onto the pellicle, e.g. by the source itself or other optical components. This may be so that the illuminating radiation L is focused onto a small area of the pellicle to provide local inspection.

In some embodiments, the illuminating radiation L may come from a plurality of radiation sources, e.g. 2, 3 or 4 separate radiation sources. The plurality of radiation sources may illuminate the full pellicle 19, a width of the pellicle 19, or at least a substantial part of the pellicle 19. This may provide a quicker check for particles 24 on the pellicle 19 than other methods and may allow more than one particle 24 located on the pellicle 19 to be detected at the same time. In some embodiments, the radiation source may be a LED source. In other embodiments, the radiation source may be a different type of illuminator from an LED, such as a laser or any other monochrome radiation source.

Since the pellicle 19 is substantially transparent, some of the illuminating radiation L may also pass through the pellicle 19 (see transmitted radiation T in dashed line) and reflect off the pattern 21 of the patterning device MA (see reflected transmitted radiation RT in dashed line). The reflected transmitted radiation RT may pass through the pellicle 19 and be incident on the radiation sensor 84. Therefore, a patterning device MA pattern or other object on the patterning device MA may be included in reflected radiation which may produce one or more ghost patterns detected by the radiation sensor 84. The one or more ghost patterns are undesirable as they may be incorrectly considered as a defect. Additional image post-processing algorithms may be used to filter out the one or more ghost patterns, which may not be reliable all the time.

Patterning devices MA with pellicles 19 that are measured for pellicle defects can suffer from 'ghosting'. Ghosting occurs from, e.g., patterning device MA features that diffract incident radiation and thus disturb a scatterometer particle measurement.

To solve this problem, in an embodiment, a wavelength of illuminating radiation L is used that has a wavelength that is substantially not transmitted through the pellicle 19. That is, the transmission of radiation at this wavelength through the pellicle 19 is very low. The transmittance of the radiation through the pellicle may be less than or equal to 10%, 1%, or 0.1%. The transmittance of the radiation through the pellicle may be in a range of 1-10%. In other words, the wavelength of illuminating radiation L used is one that is substantially absorbed and reflected by the pellicle 19 such that there is little transmission of the radiation through the pellicle 19 to be incident on the patterning device MA. Thus, in this embodiment, the wavelength of the illuminating radiation L is significant. There is only a small fraction of the radiation transmitted with the rest of the radiation being, e.g., about 50% absorbed and 50% reflected.

The illuminating radiation L that is incident on, and/or may be reflected from, the pellicle and any particle(s) located on the pellicle, may be considered to be radiation associated with the pellicle. The pellicle 19 is substantially optically flat and so would not produce scattering of radiation and would only produce specular reflection of the radiation. However, if the radiation reaches the patterning device then there would be scattering of the radiation.

The radiation sensor 84 is configured to measure the radiation having the wavelength that has substantially low transmittance through the pellicle 19. The radiation sensor 84 can receive the radiation and determine whether a particle is present on the pellicle or not. The radiation sensor 84 is also configured to provide the radiation at this wavelength to be incident on the pellicle 19.

The radiation sensor 84 may be a reticle backside inspection (RBI) system which may already be in use for inspecting the back of the patterning device MA. This method of using the RBI system to also carry out pellicle frontside inspection (PFI) reduces the number of components used for inspection. Also, this means that the inspection can be carried out in the lithographic apparatus LA.

The wavelength of the radiation may be 365 nm. The transmission of radiation through a polycrystalline silicon (pSi) pellicle is very low at this wavelength. The transmission of the radiation is very low down to below approximately 200 nm. In other embodiments, the wavelength of the radiation may be chosen to be e.g. 192 nm. Higher wavelengths of radiation may be chosen as they may have lower cost to use when compared to lower wavelengths. In other embodiments, wavelength of the radiation for the pSi pellicle may be selected from: 356 nm-365 nm, 356 nm-370 nm, 356 nm-375 nm, 361 nm-365 nm, 361 nm-370 nm, 361 nm-375 nm, or 364 nm-366 nm. It will be appreciated that other wavelengths of radiation may be used, for example, any wavelength of radiation between approximately 180 nm-380 nm may be used.

Figure 18:
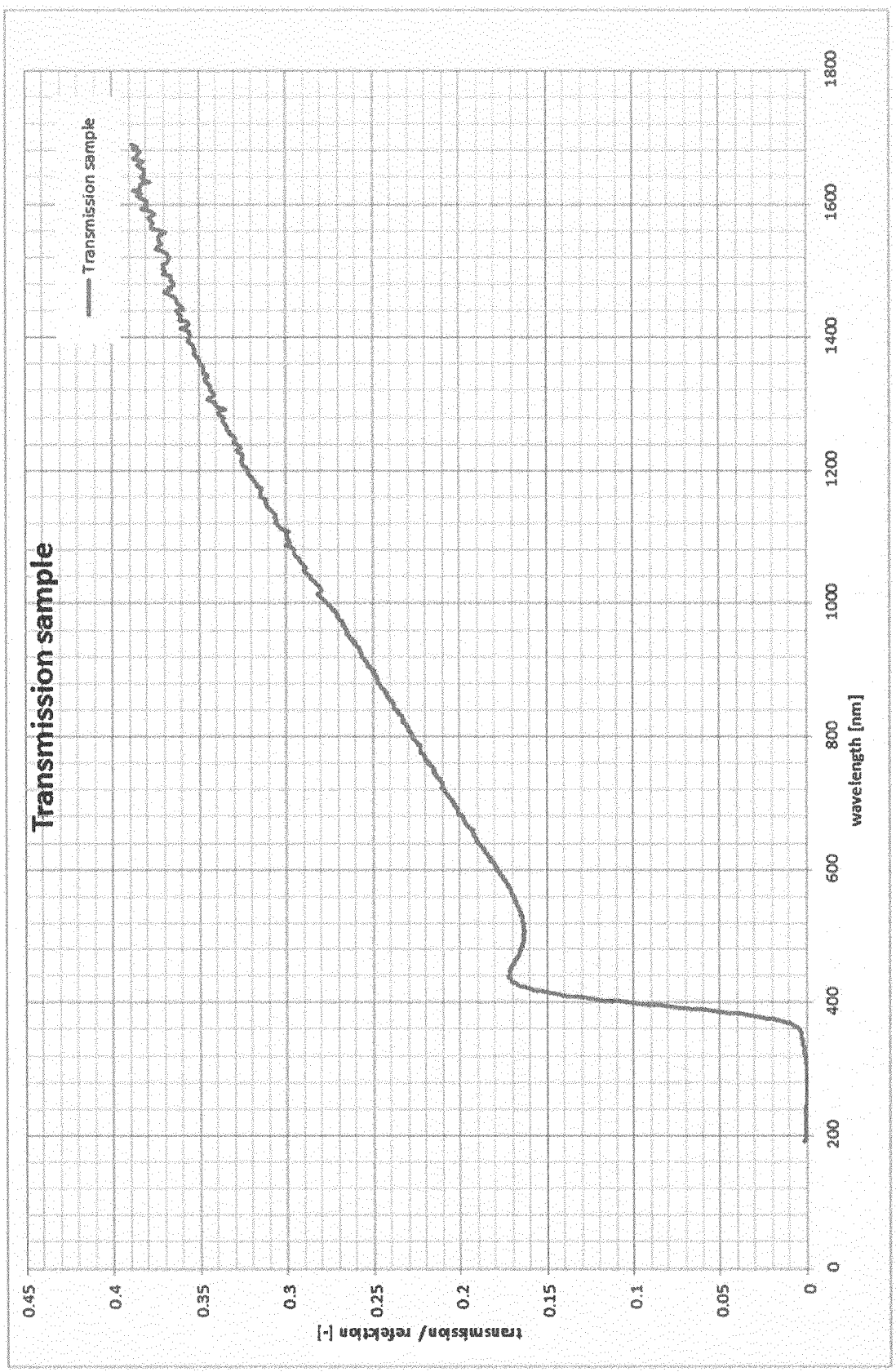
FIG. 18 depicts a graph of wavelength of radiation against transmission through a pellicle.

FIG. 18 shows a graph of wavelength (nm) of radiation against transmission (%) of radiation through a pSi based pellicle 19. The pellicle may be made from different materials. For example, the pellicle 19 may be made from silicon, or molybdenum silicon (MoSi). From the graph, it can be seen that the transmission through the pellicle 19 starts to dip at around 440 nm and reaches a transmission of about 0.01 at about 370 nm. At approximately 365 nm the transmission through the pellicle 19 is almost zero. Pellicles made from other materials may also have a dip at or around these wavelengths. Typical thickness of pellicles that may be used may be around 50 nm. However, the actual thickness of the pellicle is not significant provided the illumination wavelength is sufficiently suppressed and the transmission of the illuminating radiation L is sufficiently reduced.

The use of shearing incidence radiation at a wavelength of 365 nm to illuminate the pellicle 19 means that the radiation is substantially prevented from passing through the pellicle 19 to reach the patterning device MA. Therefore, using this method, ghosting may be prevented or at least substantially reduced when compared to using other wavelengths of radiation.

The inspection of the pellicle 19 by the radiation sensor 84 may be considered to be measuring a property associated with the pellicle 19, the property being indicative of the pellicle condition. The pellicle condition may be, for example, a particle located on the pellicle 19 or a defect in the pellicle 19, such as a hole or rupture of the pellicle 19.

The measurements of the property or properties associated with the pellicle by the sensor or sensors are used to determine the condition or conditions associated with the pellicle. This may be done in any way as known in the art. For example, this could include manual processing by a human operator or may involve a computer apparatus.

A computer program may be used which includes comprising computer readable instructions configured to cause a computer to carry out a method described herein. A computer readable medium may carry this computer program.

A computer apparatus may be used to determine a condition associated with a pellicle. The computer apparatus may include a memory storing processor readable instructions and a processor arranged to read and execute instructions stored in the memory. The processor readable instructions may comprise instructions arranged to control the computer to carry out a method described herein.

In an example, an embodiment of the invention may form part of a patterning device (mask) MA inspection apparatus. The patterning device inspection apparatus may use EUV radiation to illuminate a patterning device (e.g., a mask) and use an imaging sensor to monitor radiation reflected from the patterning device. Images received by the imaging sensor are used to determine whether or not defects are present in the patterning device. These imaging sensors may be e.g. the sensor 26 or the radiation sensor 52 and the images may be of IR radiation or other forms of radiation. Thus, the condition of the patterning device be determined using the imaging sensors in a similar way to as described above. The patterning device inspection apparatus may include optics (e.g. mirrors) configured to receive EUV radiation from an EUV radiation source and form it into a radiation beam to be directed at a patterning device. The patterning device inspection apparatus may further include optics (e.g. mirrors) configured to collect EUV radiation reflected from the patterning device and form an image of the patterning device at the imaging sensor. The patterning device inspection apparatus may include a processor configured to analyse the image of the patterning device at the imaging sensor, and to determine from that analysis whether any defects are present on the patterning device. The processor may further be configured to determine whether a detected patterning device defect will cause an unacceptable defect in images projected onto a substrate when the patterning device is used by a lithographic apparatus.

In an example, an embodiment of the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus LA and may be used to measure the overlay before the substrate (and the resist) has been processed.

Although specific reference may be made in this text to examples of the invention in the context of a lithographic apparatus, examples of the invention may be used in other apparatus. Examples of the invention may form part of a patterning device inspection apparatus, a metrology apparatus, or any apparatus that measures or processes an object such as a wafer (or other substrate) or a mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of examples of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Examples of the invention may be implemented in hardware, firmware, software, or any combination thereof. Examples of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. Embodiments of the invention may be implemented as a control system of an apparatus. The control system may comprise hardware and/or software.

While specific examples of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. An apparatus for determining a condition associated with a pellicle for use in a lithographic apparatus, the apparatus comprising a sensor, wherein the sensor is configured to measure a property associated with the pellicle, the property being indicative of the pellicle condition.
2. The apparatus according to clause 1, wherein the property associated with the pellicle is a temperature or a temperature profile of the pellicle and/or a temperature or a temperature profile of a particle on the pellicle.
3. The apparatus according to clause 2, wherein the sensor is configured to measure infrared radiation (IR) associated with the pellicle.
4. The apparatus according to clause 3, wherein the sensor is configured to measure the intensity of the IR emission in a wavelength band of 2-8 μm.
5. The apparatus according to clause 3 or clause 4, wherein the sensor is configured to measure an IR emission differential.
6. The apparatus according to any of clauses 3 to 5, wherein the sensor comprises a photodiode that is configured to provide a bias voltage that is scannable to establish an IR emission spectrum.
7. The apparatus according to any of clauses 2-6, wherein the sensor is configured to locate the particle on the pellicle by identifying a contrast between the infrared radiation being received from the particle and the pellicle.
8. The apparatus according to any of clauses 2-7, configured to actively control the power of a radiation beam to maintain the pellicle at a predetermined temperature.
9. The apparatus according to any of clauses 2-8, wherein the apparatus is configured to activate a split exposure scheme based on the temperature measurement.
10. The apparatus according to any of clauses 2-9, comprising at least one transparent layer that allows IR radiation to pass.
11. The apparatus according to any preceding clause, wherein the sensor is configured to be located substantially centrally in a pupil facet module in the lithographic apparatus.
12. The apparatus according to any preceding clause, wherein the sensor is configured to be located at an angle of incidence with respect to the pellicle of at least 45°.
13. The apparatus according to clause 1, wherein the sensor is integrated into a pellicle carrier.
14. The apparatus according to clause 1 or clause 13, wherein the property associated with the pellicle is capacitance and the sensor is a capacitance sensor.
15. The apparatus according to clause 14, configured such that electrical contacts of the sensor are connectable from outside the pellicle carrier while the pellicle carrier is closed.
16. The apparatus according to clause 1, configured such that the pellicle is illuminated with radiation over a predefined pellicle area and the sensor is configured to measure the radiation reflected from the pellicle.
17. The apparatus according to clause 16, configured to successively illuminate predefined pellicle areas with radiation.
18. The apparatus according to clause 16 or clause 17, wherein the predefined pellicle area is an illumination line.
19. The apparatus according to clause 18, wherein the illumination line is formed from a plane of illumination intersecting with the pellicle.
20. The apparatus according to any of clauses 16-19, configured to illuminate the pellicle at an angle of incidence with respect to the pellicle of at least 45°.

21. The apparatus according to any of clauses 16-20, wherein the sensor is orientated so as to not to be in the path of specular reflection from the pellicle.
22. The apparatus according to clause 21, wherein the sensor is orientated perpendicularly to an illuminating plane.
23. The apparatus according to clause 16, comprising a shadowing structure comprising an aperture configured to shadow at least part of a patterning device while allowing the radiation to be incident on the pellicle.
24. The apparatus according to clause 23, wherein the aperture has a width such that a pre-defined pellicle area can be viewed by the sensor while the visibility of a patterning device pattern is substantially reduced due to shadowing effects of the shadowing structure.
25. The apparatus according to clause 1, wherein the sensor is associated with a pellicle frame of a pellicle assembly.
26. The apparatus according to clause 25, wherein the sensor is at least partially in the pellicle frame.
27. The apparatus according to clause 25 or clause 26, wherein the sensor is a proximity sensor configured to measure distance to the pellicle.
28. The apparatus according to clause 27, wherein the proximity sensor is a cap gauge sensor or an induction sensor.
29. The apparatus according to any of clauses 25-28, configured to wirelessly transmit data from the sensor.
30. The apparatus according to clause 1, wherein the sensor is configured to filter out signals other than signals from an inspection plane, wherein the inspection plane corresponds to the location of the pellicle.
31. The apparatus according to clause 30, wherein the sensor is a light field camera and wherein the light field camera is configured to only output radiation intensity information from the depth of the inspection plane.
32. The apparatus according to clause 31, wherein the light field camera is configured to filter out radiation intensity information that spans a particular range of angles known to not correspond to the inspection plane.
33. The apparatus according to any of clauses 30-32, configured to operate a particle detection algorithm on the signals corresponding to the inspection plane.
34. The apparatus according to any of clauses 30-33, wherein the inspection plane corresponds to a range of maximum pellicle displacement.
35. The apparatus according to clause 1, further comprising a radiation source configured to illuminate the pellicle with radiation having a wavelength that is substantially not transmitted through the pellicle, and wherein the sensor is configured to measure the radiation associated with the pellicle.
36. The apparatus according to clause 35, wherein the transmittance of the radiation through the pellicle is less than or equal to 10%, 1%, or 0.1%.
37. The apparatus according to clause 35 or clause 36, wherein the pellicle is a polycrystalline pellicle and the wavelength of the radiation is in a range of: 180 nm-380 nm, 356 nm-365 nm, 356 nm-370 nm, 356 nm-375 nm, 361 nm-365 nm, 361 nm-370 nm, 361 nm-375 nm, or 364 nm-366 nm.
38. The apparatus according to clause 37, wherein the wavelength of the radiation is 365 nm.
39. The apparatus according to any of clauses 35-38, configured such that the radiation is collimated or divergent when incident on the pellicle.
40. The apparatus according to clause 39, configured such that the pellicle is illuminated over part of the width, the full width or the full area, of the pellicle at once.
41. The apparatus according to clause 39 or clause 40, further comprising a plurality of radiation sources.
42. The apparatus according to any of clauses 35-41, wherein the pellicle is made from silicon or MoSi.
43. The apparatus according to any of clauses 35-42, wherein the sensor comprises the radiation source and/or a patterning device backside inspection tool.
44. The apparatus according to any preceding clause, wherein the sensor is configured to measure the property associated with the pellicle when the pellicle is in a radiation beam exposure position in the lithographic apparatus.
45. The apparatus according to clause 44, wherein the sensor is configured to measure the property associated with the pellicle when the exposure radiation beam is incident on the pellicle in the radiation beam exposure position.
46. The apparatus according to clause 44 or clause 45, comprising a filter configured to filter out radiation from the exposure radiation beam.
47. The apparatus according to any of clauses 44 to 46, configured to stop the exposure radiation beam and/or prevent further pulses of the exposure radiation beam based on the condition associated with the pellicle.
48. The apparatus according to any preceding clause, wherein the condition associated with the pellicle is one or more selected from: lifetime of the pellicle, integrity of the pellicle, a defect in the pellicle, a local transmission change of the pellicle, a particle located on the pellicle, a stain on the pellicle, a deformation of the pellicle, an impending rupture of the pellicle, a rupture of the pellicle, and/or the presence of the pellicle.
49. The apparatus according to any preceding clause, wherein the sensor is not in direct line of sight of the pellicle.
50. An assembly comprising the apparatus according to any of clauses 1 to 49 and a lithographic apparatus, the lithographic apparatus comprising:
    an illumination system configured to condition a radiation beam;
    a support structure constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto the substrate.
51. A method of determining a condition associated with a pellicle for use in a lithographic apparatus, the method comprising measuring a property associated with the pellicle using a sensor, the property being indicative of the pellicle condition.
52. The method of clause 51, wherein the property associated with the pellicle is a temperature profile of the pellicle and/or a temperature profile of a particle on the pellicle.
53. The method of clause 52, wherein the measuring comprises measuring infrared radiation (IR) associated with the pellicle using the sensor.
54. The method of clause 53, further comprising identifying the particle on the pellicle by identifying a contrast between the infrared radiation being received from the particle and the pellicle.

55. The method of any of clauses 51-54, further comprising determining a maximum allowed power for a pellicle and/or a pellicle and patterning device pair.
56. The method of clause 51, further comprising measuring the property associated with the pellicle when the sensor is integrated into a pellicle carrier.
57. The method of clause 51 or clause 56, further comprising measuring a capacitance of the pellicle using a capacitance sensor.
58. The method of clause 51, further comprising illuminating the pellicle with radiation over a predefined pellicle area and measuring the radiation reflected from the pellicle with the sensor.
59. The method of clause 58, further comprising successively illuminating predefined pellicle areas with the radiation.
60. The method of clause 58 or clause 59, further comprising illuminating the predefined pellicle area using a plane of illumination that forms an illumination line when it intersects with the pellicle.
61. The method of any of clauses 58-40, further comprising illuminating the pellicle at an angle of incidence with respect to the pellicle of at least 45°.
62. The method of any of clauses 58-61, further comprising orientating the sensor so as to be perpendicular to the illuminating plane.
63. The method of clause 51, further comprising illuminating the pellicle and viewing a pre-defined pellicle area with the sensor while substantially reducing the visibility of a patterning device pattern from a patterning device due to shadowing effects of a shadowing structure comprising an aperture.
64. The method according to clause 51, wherein the sensor is associated with a pellicle frame of a pellicle assembly.
65. The method according to clause 64, further comprising measuring the distance to the pellicle using a proximity sensor.
66. The method according to clause 64 or clause 65, further comprising wirelessly transmitting data from the sensor.
67. The method according to clause 51, further comprising filtering out signals other than signals from an inspection plane, wherein the inspection plane corresponds to the location of the pellicle.
68. The method according to clause 67, wherein the sensor is a light field camera, the method further comprising only outputting radiation intensity information from the depth of the inspection plane.
69. The method according to clause 67 or clause 68, further comprising operating a particle detection algorithm on the signals corresponding to the inspection plane.
70. The method according to clause 51, further comprising illuminating the pellicle with radiation having a wavelength that is substantially not transmitted through the pellicle and measuring the radiation associated with the pellicle using the sensor.
71. The method according to clause 70, wherein the transmittance of the radiation through the pellicle is less than or equal to 10%, 1%, or 0.1%.
72. The method according to clause 70 or clause 71, wherein the pellicle is a polycrystalline pellicle and the wavelength of the radiation is in a range of: 180 nm-380 nm, 356 nm-365 nm, 356 nm-370 nm, 356 nm-375 nm, 361 nm-365 nm, 361 nm-370 nm, or 361 nm-375 nm.
73. The method according to clause 72, wherein the wavelength of the radiation is 365 nm.
74. The method according to any of clauses 70-73, further comprising illuminating the pellicle with radiation that is collimated or divergent when incident on the pellicle.
75. The method according to clause 74, further comprising illuminating the pellicle over part of the width, the full width or the full area, of the pellicle at once.
76. The method according to clause 74 or clause 75, further comprising illuminating the pellicle from a plurality of radiation sources.
77. The method according to any of clauses 70-76, wherein the pellicle is made from silicon or MoSi.
78. The method according to any of clauses 70-77, further comprising using the sensor to illuminate the pellicle with the radiation having the wavelength that is substantially not transmitted through the pellicle.
79. The method of any of clauses 51-78, wherein the measuring comprises measuring the property associated with the pellicle when the pellicle is in a radiation beam exposure position in the lithographic apparatus.
80. The method of clause 79, further comprising measuring the property associated with the pellicle when the exposure radiation beam is incident on the pellicle in the radiation beam exposure position.
81. The method of clause 79 or clause 80, further comprising stopping the exposure radiation beam and/or preventing further pulses of the exposure radiation beam based on the condition associated with the pellicle.
82. The method of any of clauses 51 to 81, wherein the condition associated with the pellicle is one or more selected from: lifetime of the pellicle, integrity of the pellicle, a defect in the pellicle, a transmission change of the pellicle, a particle located on the pellicle, a stain on the pellicle, a deformation of the pellicle, an impending rupture of the pellicle, a rupture of the pellicle, and/or the presence of the pellicle.
83. A computer program comprising computer readable instructions configured to cause a computer to carry out a method according to any of clauses 51 to 82.
84. A computer readable medium carrying a computer program according to clause 83.
85. A computer apparatus configured to determine a condition associated with a pellicle, the computer apparatus comprising:
a memory storing processor readable instructions; and
a processor arranged to read and execute instructions stored in the memory,
wherein the processor readable instructions comprise instructions arranged to control the computer to carry out a method according to any of clauses 51 to 82.

The invention claimed is:
1. An apparatus for determining a condition associated with a pellicle for use in a lithographic tool, the apparatus comprising a sensor configured to detect infrared radiation (IR) emitted from a region of the pellicle illuminated or arranged to be illuminated by the lithographic tool, wherein the sensor is configured to measure a property associated with the pellicle, the property being indicative of a pellicle condition and to measure the pellicle when mounted in relation to an object it is designed to protect, wherein the sensor is configured to substantially avoid measurement of infrared radiation from the object and/or the apparatus is configured to determine the condition by substantially avoiding measurement of infrared radiation from the object.

2. The apparatus according to claim 1, wherein the property associated with the pellicle is a temperature or a temperature profile of the pellicle and/or a temperature or a temperature profile of a particle on the pellicle.

3. The apparatus according to claim 1, wherein the sensor is configured to measure an IR emission differential.

4. The apparatus according to claim 1, wherein the sensor is configured to filter out signals other than signals from an inspection plane, wherein the inspection plane corresponds to the location of the pellicle.

5. The apparatus according to claim 1, wherein the sensor is configured to measure the property associated with the pellicle when the pellicle is in a radiation beam exposure position in the lithographic tool.

6. The apparatus according to claim 1, wherein the condition associated with the pellicle is one or more selected from: lifetime of the pellicle, integrity of the pellicle, a defect in the pellicle, a local transmission change of the pellicle, a particle located on the pellicle, a stain on the pellicle, a deformation of the pellicle, an impending rupture of the pellicle, a rupture of the pellicle, and/or the presence of the pellicle.

7. An assembly comprising the apparatus according to claim 1 and a lithographic tool, the lithographic tool comprising:
   a support structure constructed to support a patterning device, the patterning device being capable of imparting a radiation beam with a pattern in its cross-section to form a patterned radiation beam;
   a substrate table constructed to hold a substrate; and
   a projection system configured to project the patterned radiation beam onto the substrate.

8. The apparatus according to claim 1, wherein the sensor is configured to substantially avoid measurement of infrared radiation from the object and does so by being located at an angle of incidence of at least 45 degrees with respect to the pellicle to suppress infrared radiation from the object.

9. The apparatus according to claim 1, wherein the apparatus is configured to determine the condition by substantially avoiding measurement of infrared radiation from the object and does so by considering only infrared radiation within a certain blackbody wavelength range associated with the pellicle.

10. The apparatus according to claim 1, wherein the sensor is configured to locate a particle on the pellicle by identifying a contrast between the infrared radiation being received from the particle and the pellicle.

11. The apparatus according to claim 1, wherein the sensor comprises a photodiode that is configured to provide a bias voltage that is scannable to establish an IR emission spectrum.

12. The apparatus according to claim 1, configured to activate a split exposure scheme based on the measured property.

13. A method of determining a condition associated with a pellicle for use in a lithographic apparatus, the method comprising detecting, using a sensor, infrared radiation (IR) emitted from a region of the pellicle illuminated or arranged to be illuminated by the lithographic tool while the pellicle is mounted in relation to an object it is designed to protect and measuring, based on the detected infrared radiation, a property associated with the pellicle, the property being indicative of the pellicle condition, wherein the sensor is configured to substantially avoid measurement of infrared radiation from the object and/or the condition associated with the pellicle is determined by substantially avoiding measurement of infrared radiation from the object.

14. The method of claim 13, wherein the sensor is configured to measure an IR emission differential.

15. The method of claim 13, further comprising filtering out signals other than signals from an inspection plane, wherein the inspection plane corresponds to the location of the pellicle.

16. The method of claim 13, wherein the condition associated with the pellicle is one or more selected from: lifetime of the pellicle, integrity of the pellicle, a defect in the pellicle, a local transmission change of the pellicle, a particle located on the pellicle, a stain on the pellicle, a deformation of the pellicle, an impending rupture of the pellicle, a rupture of the pellicle, and/or the presence of the pellicle.

17. The method of claim 13, wherein the sensor is configured to substantially avoid measurement of infrared radiation from the object and does so by being located at an angle of incidence of at least 45 degrees with respect to the pellicle to suppress infrared radiation from the object.

18. The method of claim 13, wherein the condition associated with the pellicle is determined by substantially avoiding measurement of infrared radiation from the object and done so by considering only infrared radiation within a certain blackbody wavelength range associated with the pellicle.

19. The method of claim 13, comprising locating a particle on the pellicle by identifying a contrast between the infrared radiation being received from the particle and the pellicle.

20. The method of claim 13, wherein the sensor comprises a photodiode that is configured to provide a bias voltage that is scannable to establish an IR emission spectrum.

* * * * *